United States Patent
Sasagawa et al.

(10) Patent No.: US 7,911,788 B2
(45) Date of Patent: Mar. 22, 2011

(54) STORAGE CONTROL DEVICE

(75) Inventors: Tsuyoshi Sasagawa, Odawara (JP); Akihiro Inamura, Hadano (JP); Rei Arikawa, Nakai (JP); Minoru Shimokawa, Odawara (JP); Kiyoshi Honda, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 197 days.

(21) Appl. No.: 12/356,744

(22) Filed: Jan. 21, 2009

(65) Prior Publication Data

US 2010/0118484 A1 May 13, 2010

(30) Foreign Application Priority Data

Nov. 12, 2008 (JP) ................................. 2008-290062

(51) Int. Cl.
*H05K 7/20* (2006.01)

(52) U.S. Cl. ... 361/695; 361/690; 361/694; 165/104.34; 165/122; 454/184

(58) Field of Classification Search .......................... None
See application file for complete search history.

(56) References Cited

U.S. PATENT DOCUMENTS

| | | | | |
|---|---|---|---|---|
| 6,675,976 B2 * | 1/2004 | Steinman et al. | ............... | 211/26 |
| 6,826,046 B1 * | 11/2004 | Muncaster et al. | ....... | 361/679.33 |
| 7,042,722 B2 * | 5/2006 | Suzuki et al. | ................. | 361/695 |
| 7,139,170 B2 * | 11/2006 | Chikusa et al. | ............... | 361/695 |
| 7,411,787 B2 * | 8/2008 | Katakura et al. | ............... | 361/695 |
| 7,436,663 B2 * | 10/2008 | Matsushima et al. | ......... | 361/695 |
| 7,593,225 B2 * | 9/2009 | Sasagawa et al. | ............. | 361/695 |
| 7,701,710 B2 * | 4/2010 | Tanaka et al. | ............... | 361/679.5 |
| 2006/0048001 A1 | 3/2006 | Honda et al. | | |
| 2007/0002847 A1 | 1/2007 | Inamura et al. | | |
| 2007/0010899 A1 | 1/2007 | Ozaki et al. | | |
| 2009/0294107 A1 * | 12/2009 | Nishiyama et al. | ...... | 165/104.34 |

FOREIGN PATENT DOCUMENTS

| | | |
|---|---|---|
| JP | 55-179098 | 12/1980 |
| JP | 07-131173 | 5/1995 |
| JP | 2003-036669 | 2/2003 |
| JP | 2004-102665 | 4/2004 |
| JP | 2006-073045 | 3/2006 |
| JP | 2007-011682 | 1/2007 |
| JP | 2007-018034 | 1/2007 |

OTHER PUBLICATIONS

Office Action in Japanese Patent Application JP 2008-290062, mailed Dec. 7, 2010 (3 pages) [in Japanese].

* cited by examiner

*Primary Examiner* — Boris L Chervinsky
(74) *Attorney, Agent, or Firm* — Antonelli, Terry, Stout & Kraus, LLP.

(57) ABSTRACT

With the storage control device of the present invention, it is possible to mount a larger number of storage devices and to cool them effectively. A plurality of sub-storage units are provided within one storage unit. Each sub-storage unit includes a plurality of hard disk drives, a plurality of enclosures, and a plurality of power supply devices. A cover is divided into a front cover which covers over the front side of a case, and a rear cover which covers over the rear side of the case. Shield portions are provided on the upper sides of the hard disk drives and the enclosures. By these shield portions contacting the adjacent modules (other disk drives and other enclosures), it is possible to reduce the negative influence upon cooling air draft passages within the case, even when a cover has been removed.

13 Claims, 35 Drawing Sheets

FIG. 6

STORAGE UNIT MANAGEMENT TABLE (T10)

| UNIT # (C10) | SAS ADDRESS (C11) | MANUFACTURING NUMBER (C12) | PAIR # (C13) | SUB-STORAGE UNIT TYPE (C14) | VALID FLAG (C15) |
|---|---|---|---|---|---|
| 0 | Adr0 | 8000000001 | 0 | L | OK |
| 1 | Adr1 | 8000000001 | 0 | R | OK |
| 2 | Adr2 | 3000000001 | – | – | OK |
| 3 | Adr3 | 8000000002 | 1 | L | OK |
| 4 | Adr4 | 8000000002 | 1 | R | OK |

FIG. 20
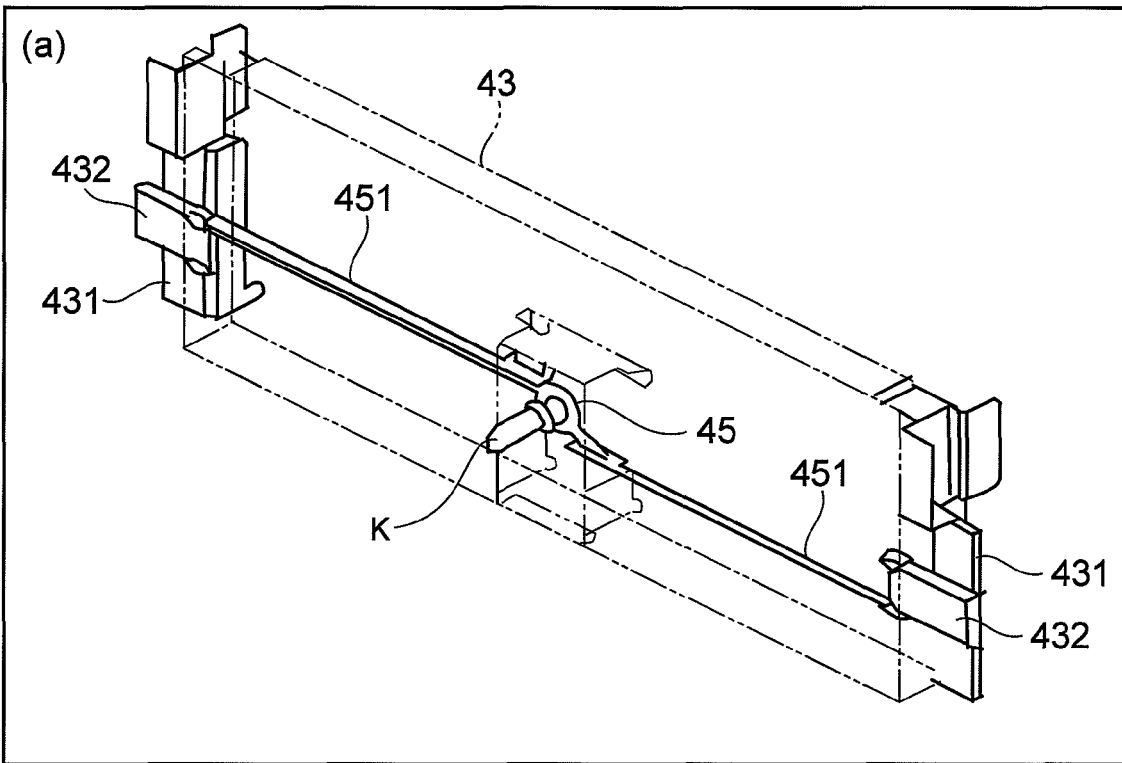
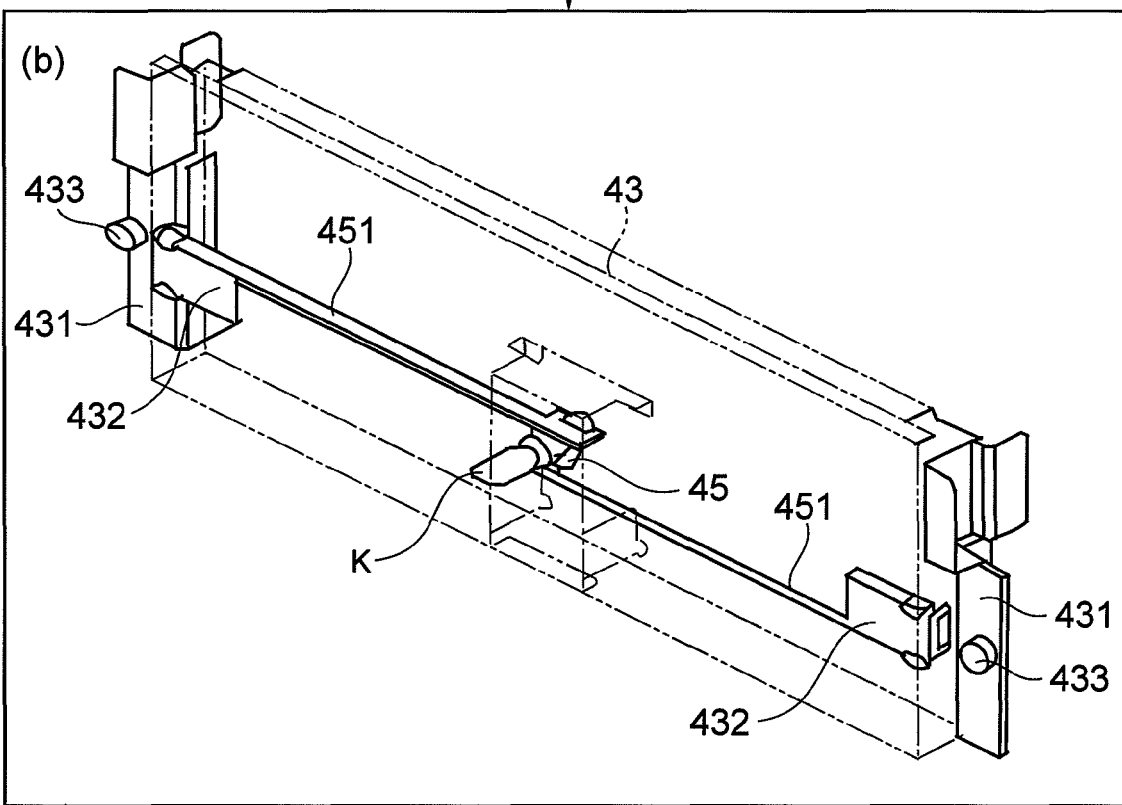

STORAGE CONTROL DEVICE

CROSS-REFERENCE TO RELATED APPLICATIONS

This application relates to and claims priority from Japanese Patent Application No. 2008-290062 filed on Nov. 12, 2008, the entire disclosure of which is incorporated herein by reference.

BACKGROUND OF THE INVENTION

The present invention relates to a storage control device.

A storage control device is a device which supplies a storage region of comparatively large capacity to a host computer (hereinafter termed a "host"). A storage control device may, for example, construct a storage region on the basis of RAID (Redundant Array of Independent Disks), using a plurality of hard disk drives. Logical volumes, which are logical storage regions, are established over the physical storage regions possessed by the hard disk drives. The host is able to perform reading and writing of data to and from these logical volumes.

Now, a storage control device is per se known (see JP-A-2007-011682) in which a main chassis which is in charge of control functions and an extension chassis which is in charge of storage functions are connected in a daisy chain. A controller and a plurality of hard disk drives are mounted in the main chassis, and a plurality of hard disk drives are mounted in the extension chassis.

With a prior art storage control device, according to requirements, the user can increase the storage capacity of the storage control device by adding extension chassis. However, the more extension chassis are added, the more does the size of the storage control device increase. Furthermore, if the number of storage devices which are provided in the extension chassis is increased, the amount of heat which is generated also increases. Accordingly, although it is necessary to obtain a draft of cooling air which is matched to this amount of heat, if simply the rotational speed of a cooling fan is increased, then the noise also becomes great.

When a lid unit which covers over an opening portion is removed, the cooling air draft passages within the chassis and this opening portion communicate with one another, and air flows into the cooling air draft passage from the opening portion, whose flow resistance is comparatively low. Due to this, the flow of the draft of cooling air changes, and there is a possibility that the cooling air draft will not be adequately supplied to at least some of the storage devices, so that they will not be properly cooled.

In particular, for example with the so called drawer method which makes it possible to take out a storage device or the like from the upper surface of a chassis like a drawer and to put it back in, if maintenance work is to be performed without stopping the operation of the storage control device, then the above described problem of the cooling air draft appears prominently. In this case when, for maintenance work, the lid unit is removed, then the cooling air draft passages within the chassis communicate with the opening portion so that the flow of the draft of cooling air is changed, and regions occur where the draft of cooling air is not supplied. Accordingly, it is not possible to perform maintenance work over a long time period, i.e. it is necessary to complete any maintenance work in a short time period, so that the convenience of use decreases. This is because, the longer becomes the time period over which the lid unit is removed, the more does the temperature of the storage device or devices to which the cooling air draft is not adequately supplied become elevated, so that it is possible for problems due to high temperature to occur.

SUMMARY OF THE INVENTION

The present invention has been made in consideration of the problems described above, and its object is to provide a storage control device which can provide a greater storage capacity, and which moreover can be effectively cooled. Another object of the present invention is to provide a storage control device which can enhance the cooling performance and the operability of a storage unit which has a plurality of sub-storage units. Yet further objects of the present invention will become clear from the following description of embodiments thereof.

In order to solve the problem described above, the storage control device according to the present invention includes a control device and a storage unit controlled by said control device, wherein: said storage unit comprises a chassis which has an opening portion, a plurality of sub-storage units provided within said chassis which operate independently of one another, and a lid unit which closes said opening portion; and each of said sub-storage units comprises: a plurality of storage devices which are attached in one region of said chassis; at least one unit controllers in charge of communication between said storage devices and said control device, and which are provided between said storage devices; at least one power supply devices which are attached in another region of said chassis, and which supply electrical power to said storage devices and said unit controllers; a cooling fan provided within said chassis; a cooling air draft passage which is formed from one side of said chassis towards another side of said chassis, and which conducts a cooling air draft created by the operation of said cooling fan; and a shield portion which is provided so as to close said opening portion of said cooling air draft passage, in order to suppress the flow of air between said cooling air draft passage and said opening portion.

The lid unit may include a first lid unit for removably closing a region of said opening portion which corresponds to said one region, and a second lid unit for closing a region of said opening portion which corresponds to said other region, with the shield portions being provided at portions of said cooling air draft passages which correspond to said one region. Moreover, one such first lid unit may be provided for each said sub-storage unit.

One of said cooling fans may be provided at one side within each of said power supply devices, and another of said cooling fans may be provided at another side within each of said power supply devices.

The cooling air draft passages may include gaps defined between said storage devices, gaps defined between said storage devices and said unit controller, and spaces within said power supply devices.

The shield portions may include first shield portions provided to said storage devices and second shield portions provided to said unit controllers.

The shield portions may further include a third shield portion, provided to a dummy module which is fitted within said chassis instead of one said storage device.

On the two sides of said storage devices, said first shield portions may be provided on predetermined sides of said opening portions; and, on the two sides of said unit controllers, said second shield portions may be provided on the sides of said opening portions.

On the two sides of said storage devices, said first shield portions may be provided on predetermined sides of said opening portions; on the two sides of said unit controllers, said second shield portions may be provided on the side of said opening portions; and, on the two sides of said dummy module, said third shield portions may be provided on a predetermined side of said opening portion.

A plurality of display units, corresponding to said sub-storage units, may be provided to said chassis; and said unit controllers may operate those display units, among said display units, which correspond to sub-storage units designated by said control device.

It would also be acceptable for said chassis to be provided so as to be fittable and removable to a rack, via a fixing member; and for a shield portion which covers at least a portion of said fixing members, and which is for limiting the operation of said fixing member, to be operated together with a locking device provided to said chassis.

When said lock device is unlocked, the limitation of said actuation by said shield portion may be cancelled; and, when said lock device is locked, the actuation of said fixing member may be limited.

A stopper unit may be provided to said chassis, so as to be displaceable between the interior and the exterior of said chassis; and, when said lid unit is attached to said opening portion, said stopper unit may be contained within said chassis; and, when said lid unit is not attached to said opening portion, said stopper unit may project to the exterior of said chassis, so as to contact against said rack.

BRIEF DESCRIPTION OF THE DRAWINGS

FIG. 6 is an explanatory figure showing a table for managing a storage unit;

FIG. 10 is a plan view showing a printed circuit and so on;

FIG. 12 is a magnified explanatory figure showing the rear surface of the cable holder and so on;

FIG. 20 is an explanatory figure showing a situation in which a lock device and a shield plate operate together;

DESCRIPTION OF THE SPECIFIC EMBODIMENTS

Figure 1:
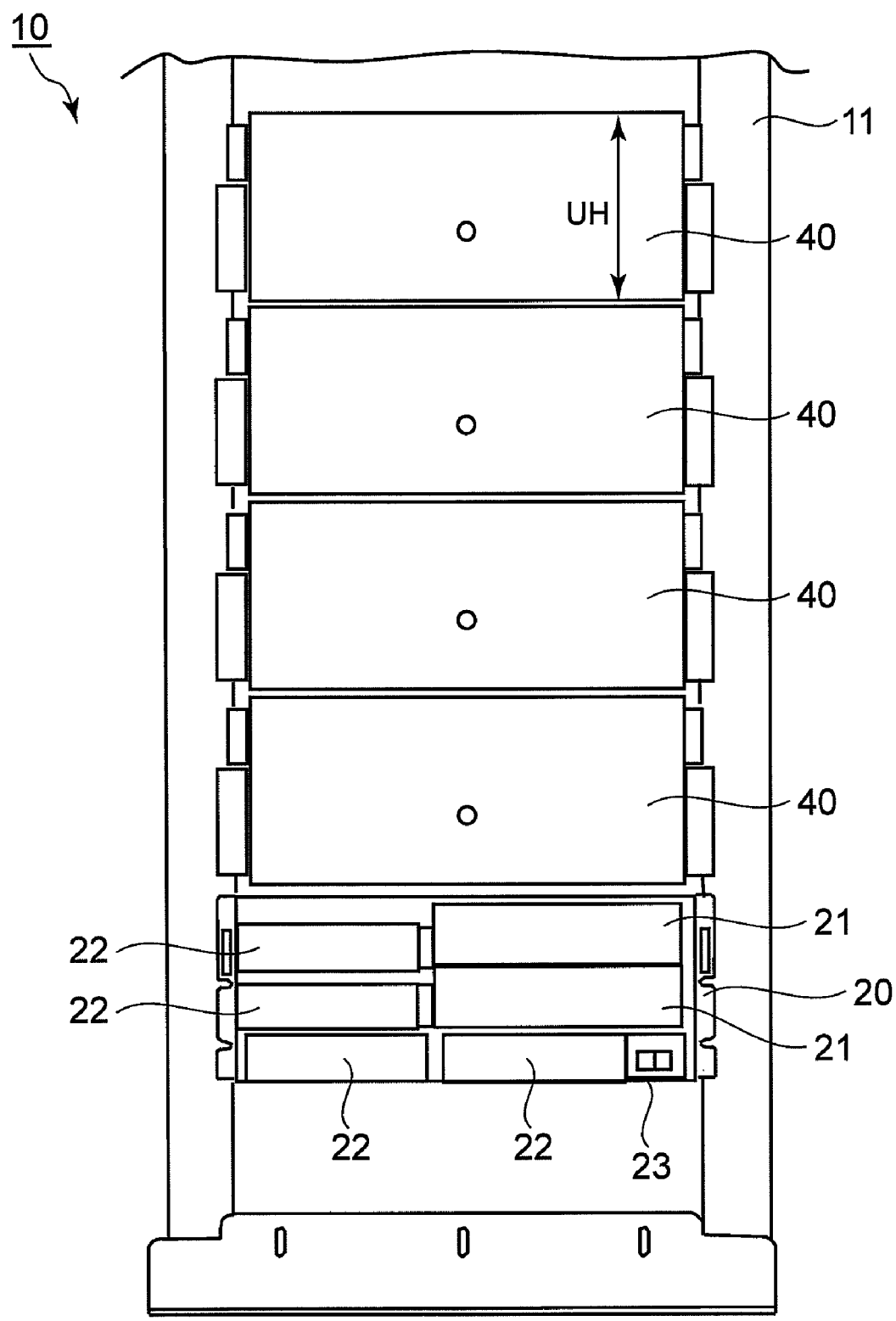
FIG. 1 is an elevation view as seen from the front of a storage control device according to a first embodiment.

In the following, embodiments of the present invention will be described with reference to the drawings. As will be described in detail hereinafter, in this embodiment, a plurality of sub-storage units 50L and 50R are provided within one storage unit 40D. The storage unit 40D is removably fitted to a rack 11. During maintenance work, the storage unit 40D is removed from the rack 11, its top plate 44F is removed, and a hard disk drive 51 or the like within its case 41 is exchanged. The hard disk drives 51 and their enclosures 52 are taken out from, and put in through, an opening portion in the upper surface of the case 41. Cooling air draft passages AF are formed in the case 41, through which cooling air drafts flow. When fans 552 which is provided at the front and the rear within the power supply device 55 operate, air which has been sucked in from the front surface of the case 41 cools the hard disk drives 51 and the enclosures 52 while flowing through the cooling air passages AF, and then is discharged from the rear surface of the power supply device 55. In order to maintain the cooling performance during maintenance work, shield portions 513 and 525 are provided to the hard disk drives 51 and the enclosures 52 and so on. Due to this, even when the top plate 44F is removed from the case 41, it is possible to reduce the influence exerted upon the cooling air draft passages AF, and it is possible to maintain the cooling performance.

Embodiment One

A first embodiment will now be explained on the basis of FIGS. 1 through 33. FIG. 1 is an elevation view of the storage control device 10. One control unit 20 and a plurality of storage units 40 are removably fitted In a rack 11 which is built, for example, as a 19 inch rack.

The control unit 20, which serves as a "control device", is a device for controlling the storage control device 10, and is, for example, fitted at the lower portion of the rack 11. The structure of this control unit 20 will be described hereinafter with reference to FIG. 3. To explain the control unit 20 as far as it is shown in FIG. 1, in addition to a controller 30 which will be described hereinafter, it also comprises, for example, a plurality of cooling fans 21, a plurality of battery devices 22, and a main switch 23. The cooling fans 21 are fans for cooling the control unit 20. The battery devices 22 supply battery power to the control unit 20 and the storage units 40 during interruptions of mains power. And the main switch 23 is a switch for starting the control device 10.

The plurality of storage units 40 are removably fitted to the rack 11 in the upper portion of the control unit 20. In each of these storage units 40, there is a high density type storage unit and a normal type storage unit. By a high density type storage unit is meant a storage unit which includes a plurality of sub-storage units 50 in its interior, and the reference symbol 40D will be appended thereto. And by a normal type storage unit is meant a storage unit which possesses no sub-storage units, and the reference symbol 40N will be appended thereto. When there is no particular requirement to distinguish between a high density type storage unit and a low density type storage unit, the reference symbol 40 will be used.

In a high density type storage unit 40D, for example, a total of 48 hard disk drives 51 may be mounted, 24 on the left side and 24 on the right side, and its height dimension UH may be, for example, 4U. And in a normal type storage unit 40N, for example, around 15 hard disk drives may be mounted, and its height dimension may be, for example, 3U, 1U is 44.45 mm (1.77 inch). In the following the explanation will center around the high density type storage unit 40D, which is the characteristic structure of this embodiment. The hard disk drives 51 correspond to "storage devices".

Figure 2:
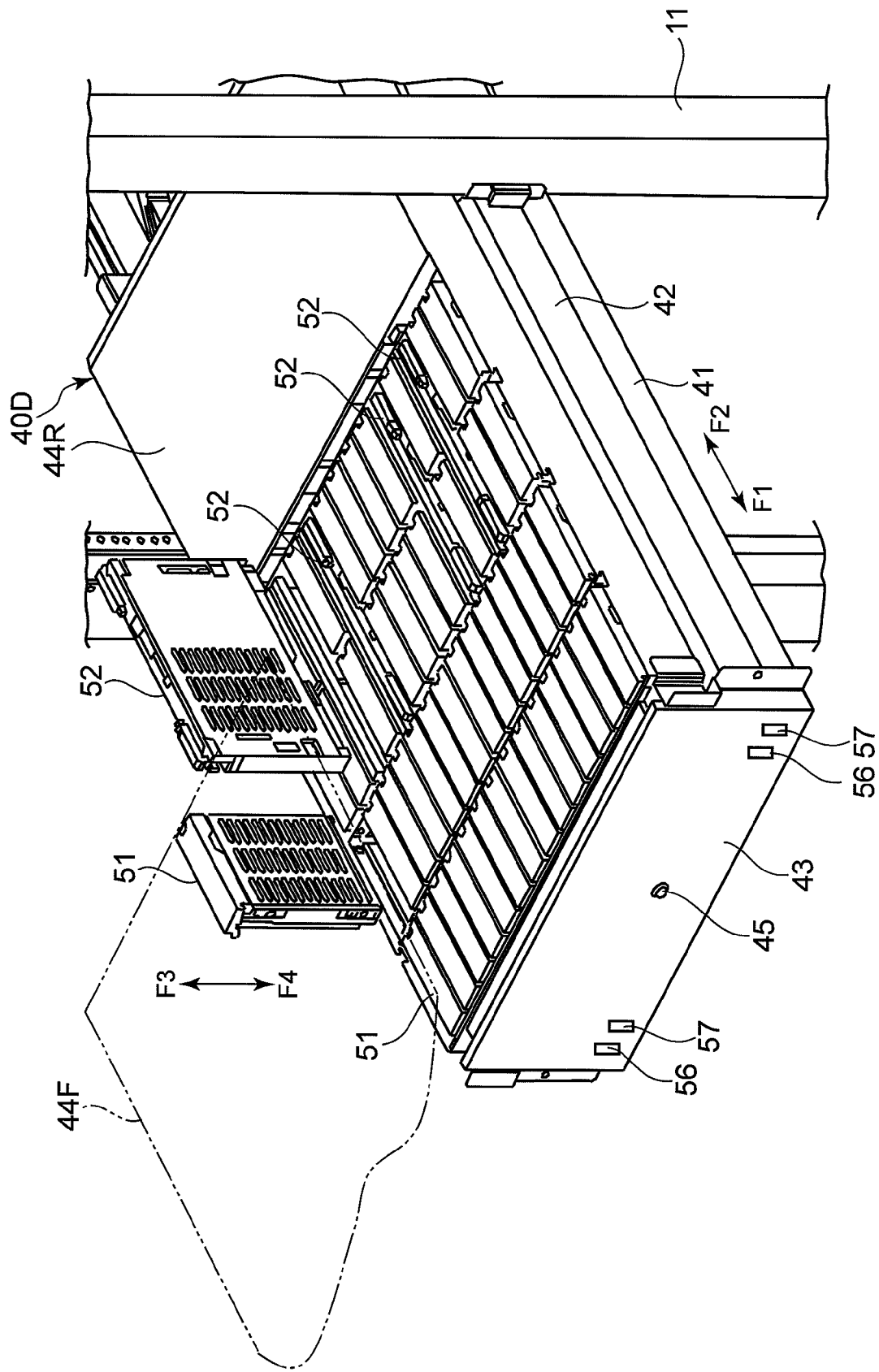
FIG. 2 is a magnified perspective view of a storage unit.

FIG. 2 is a perspective view of a high density type storage unit 40D. This high density type storage unit 40D comprises, for example, a box shaped case 41, a plurality of hard disk drives 51 and a plurality of enclosures 52 which are removably provided within the case 41, covers 44F and 44R which cover over the upper surface of the case 41, a locking device 45, and a power supply lamp 56 and a position display lamp 57 which are provided upon the front bezel 43 of the case 41. The enclosures 52 and so on will be described hereinafter.

Rails 42 are provided on both sides of the case 41, which serves as a "chassis".

The high density type storage units 40D are fitted in the rack 11 so as to be shiftable along the rails 42. For example, when exchanging a hard disk drive 51 or an enclosure 52, the user (1) inserts a key into the lock device 45 and unlocks it (refer to FIG. 19), (2) loosens the fitting screws 433 (refer to FIG. 20), (3) pulls out the storage unit 40D from the rack 11 in the direction shown by the arrow F1, (4) removes the cover 44F, which serves as a "lid unit", from the case 41, (5) pulls out the desired hard disk drive 51 or enclosure 52 from the case 41, and (6) inserts a brand new hard disk drive 51 or enclosure 52 into the case 41.

And the user (7) attaches the cover 44F to the case 41, (8) inserts the storage unit 40D, with the cover 44F attached, into the rack 11, and (9) tightens the fitting screws 433, so as to fix the storage unit 40D into the rack 11. And finally (10) the user locks up the lock device 45.

Two covers are provided: a front cover 44F which corresponds to the region where the hard disk drives 51 and the enclosures 52 are fitted, and a rear side cover 44R which corresponds to the region where power supply devices 55 are fitted. The front cover 44F is fitted to the case 41 so as to be fitted and removed comparatively easily.

By taking off the front cover 44F, the user can exchange a hard disk drive 51 or an enclosure 52 from the upper surface of the case 41. And the power supply devices 55 can be exchanged by being pulled out from the rear side of the case 41. Accordingly, when exchanging a power supply device 551 there is no need to remove the rear side cover 44R.

Figure 3:
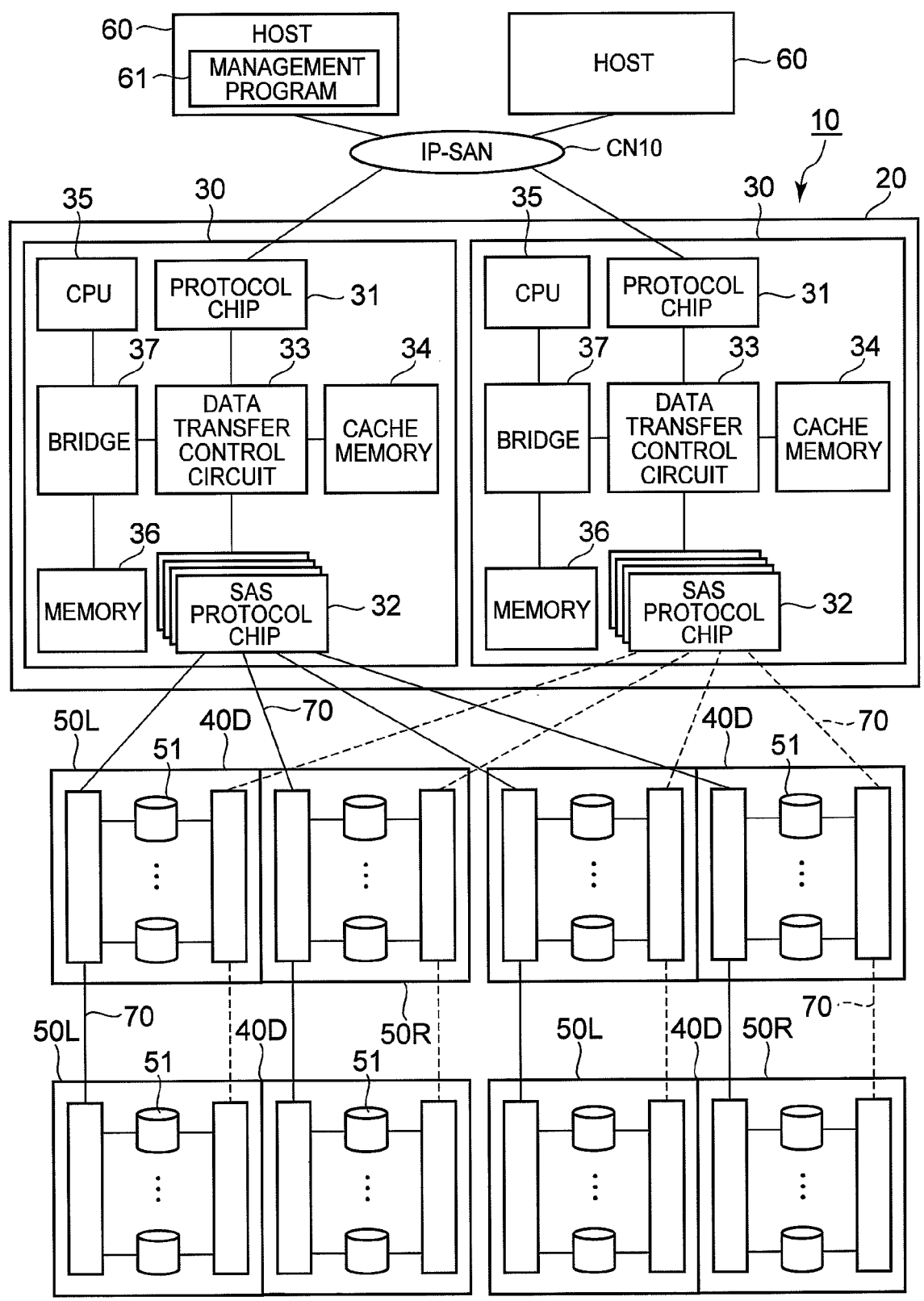
FIG. 3 is a structural diagram of a system which includes this storage control device.

The system structure of this storage control device 10 will now be explained. FIG. 3 is an explanatory figure showing the overall structure of an information processing system which is included in the storage control device 10. A host 60 is a computer device such as, for example, a server computer, a mainframe computer, a work station, a personal computer, or the like.

This storage control device 10 can connect to a plurality of hosts 60 via a communication network CN10. A management program 61 for managing the storage control device 10 is provided to one or more of the plurality of hosts 60. Using this management program 61, the user issues commands to the storage control device 10 or receives reports from the storage control device 10. The communication network CN10 consists of a FC_SAN (Fiber Channel_Storage Area Network) or an IP_SAN (Internet Protocol_SAN) or the like.

The control unit 20 comprises a plurality of controllers 30. Each of these controllers 30 has the same structure, and they operate independently. Each of the controllers 30 is connected to the storage units 40 by a different path. Accordingly, even if a problem has occurred with one of the controllers 30 so that it has stopped operating, it is still possible to read and write data by accessing the desired hard disk drive 51 from some other one of the controllers 30.

Each of the controllers 30 comprises, for example, a protocol chip 31, a SAS protocol chip 32, a data transfer control circuit 33, a cache memory 34, a CPU (Central Processing Unit) 35, a memory 36, and a bridge 37.

The protocol chip 31 is a communication control circuit for communicating with the hosts 60. The SAS protocol chip 32 is a communication control circuit for communicating with thee normal type storage units 40N and the sub-storage units 50 (in the case of a high density type storage unit 40D). A plurality of these SAS protocol chips 32 may be provided. In this embodiment, the case will be explained in which four of the SAS protocol chips 32 are provided.

The data transfer control circuit 33 is a circuit for controlling data transfer. This data transfer control circuit 33 is connected to the protocol chip 31, the SAS protocol chips 32, the cache memory 34, the CPU 35, and the memory 36.

The data transfer control circuit 33, for example, transfers data received from a host 60 via the protocol chip 31 to the cache memory 34, and transfers data stored in the cache memory 34 to the SAS protocol chips 32. Moreover, the data transfer control circuit 33 transfers data received from a hard disk drive 51 via the SAS protocol chip 32 to the cache memory 34, and transfers data stored in the cache memory 34 to the protocol chip 31.

The CPU 35 is a device which controls the operation of the controller 30. The memory 36 stores data such as computer programs and data for management and the like. The CPU 35 and the memory 36 are connected to the data transfer control circuit 33 and so on via the bridge 37.

Figure 4:
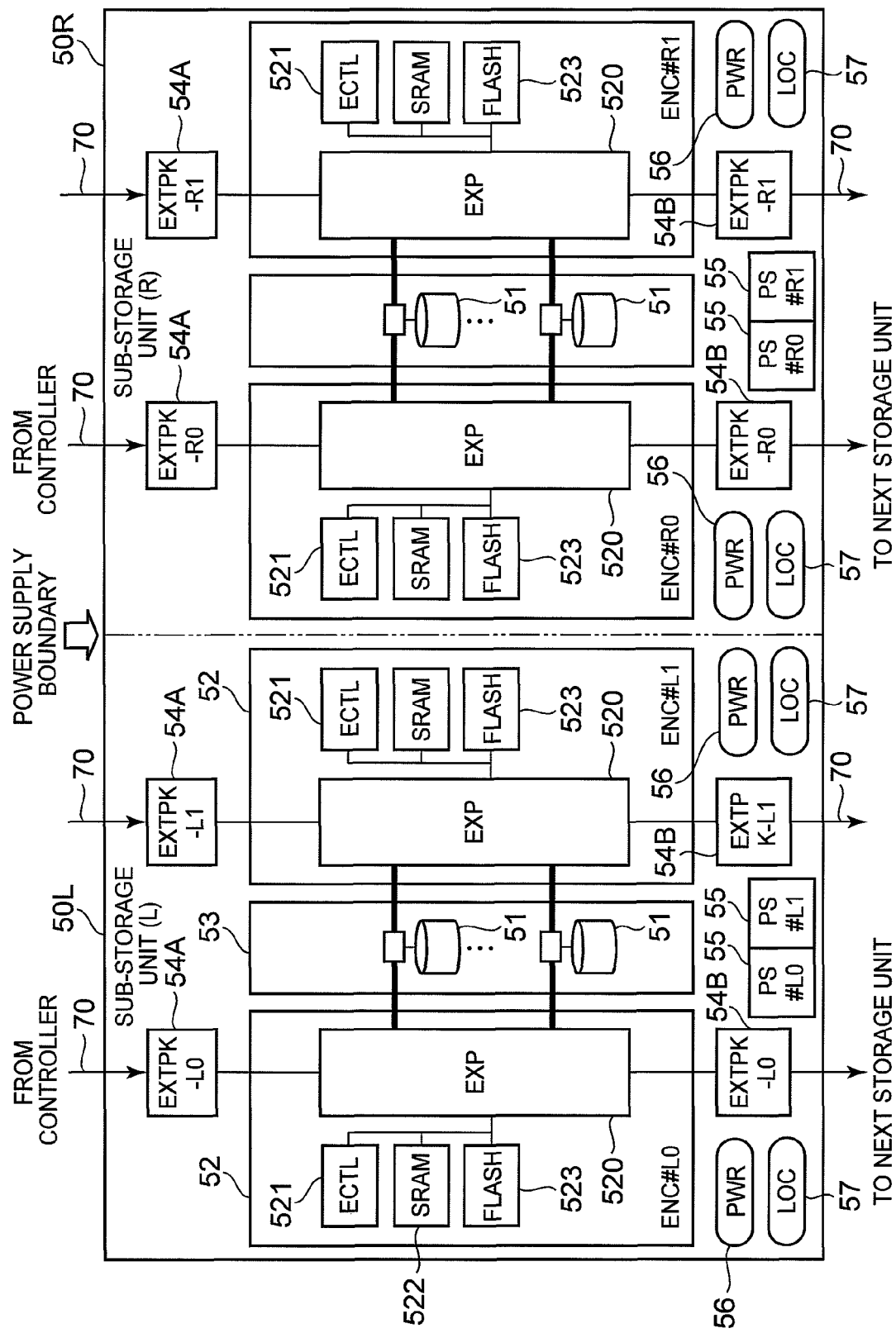
FIG. 4 is a block diagram showing the structure of sub-storage units.

FIG. 4 is a block diagram showing the structure of one of the high density type storage units 40D. This high density type storage unit 40D comprises a plurality of sub-storage units 50L and 50R. Each of these sub-storage units 50L and 50R has the same structure, and they operate independently.

To explain the left side sub-storage unit 50L, this sub-storage unit 50L comprises, for example, 24 hard disk drives 51, two enclosures 52, one back board 53, two cable holders 54A for signal input, two cable holders 54B for signal output, two power supply devices 55, one power supply lamp 56, and one position display lamp 57.

The enclosures 52, which function as "unit controllers", control communication with the hard disk drives 51. Each enclosure 52, for example, comprises an expander 520, an environment controller 521, a memory 52, and a flash memory 523. One of the enclosures 52 (#L0) and the other enclosure 52 (#L1) can each access its respective hard disk drive 51.

The expanders 520 are circuits for connecting to each of the 24 hard disk drives 51.

A cable holder 54A for signal input and a cable holder 54B for signal output are connected to each of the expanders 520. And each of the hard disk drives 51 is connected to the expander 520 of each of the enclosures 52 via a back board 53. Commands which have been issued from the controller 30 are transmitted via a cable 70 and so on to the enclosure 52 which is connected to the desired hard disk drive 51, and are processed.

The environment controllers 521 which are denoted by "ECTL" in the figure are controllers for controlling the environment. The memories 522 which are denoted by "SRAM" in the figure are memories for temporarily storing data. And the flash memories denoted by "Flash" in the figure are memories for storing manufacturing numbers and SAS addresses and so on.

Each of the power supply devices 55 supplies electrical power to one of the enclosures 52 and to its lamps 56 and 57. Even if any one of the power supply devices 55 stops due to a problem, it is still possible for electrical power to be supplied from the other power supply device 55. The cooling structure within a power supply device 55 will be further described hereinafter.

The power supply lamp and the position display lamp 57 are provided upon the front bezel 43 (refer to FIG. 2) of the high density type storage unit 40D, so as to correspond to each of the sub-storage units 50L and 50R. The power supply lamp 56 shows the state of electrical power supply to its sub-storage unit 50. If electrical power is being supplied, then the power supply lamp 56 is illuminated. And the position display lamp 57 is a lamp for informing the user of the position of its sub-storage unit 50. When the user designates any one of the sub-storage units 50 using the management program 61 on the host 60, then the position display lamp 57 which corresponds to that designated sub-storage unit 50 is illuminated.

Since the sub-storage unit 50R on the right side has a structure similar to that of the sub-storage unit 50L on the left side, description thereof will be omitted. It should be understood that since, in the case of a normal type storage unit 40N, no sub-storage units 50 are included, then only one each of the power supply lamp 56 and the position display lamp 57 are provided. Furthermore, to a normal type storage unit 40N, it is possible to mount a smaller number of hard disk drives 51 than the number of drives (48) mounted to a high density type storage unit 40D, such as for example 15 or 24 drives.

Figure 5:
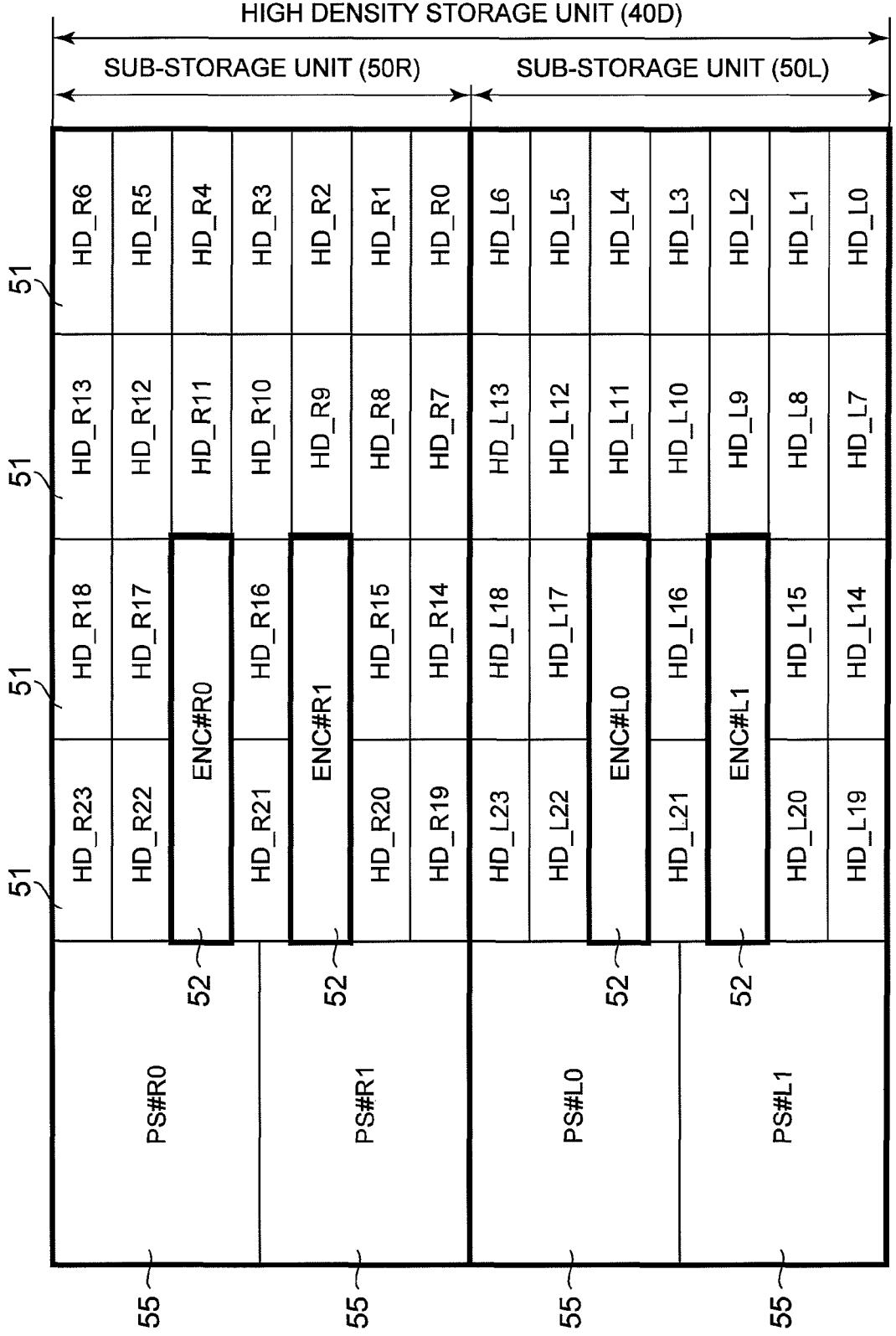
FIG. 5 is an explanatory figure showing a state in which a hard disk drive and an enclosure are contained within a storage unit.

FIG. 5 is a figure showing the case 41 as seen from directly above, in its state in which the covers 44F and 44R are removed. The sub-storage units 50L and 50R are provided on the left and right within the case 41 of the high density type storage unit 40D.

The left side sub-storage unit 50L is provided on the left side as seen from the front bezel 43 (refer to FIG. 2), and the right side sub-storage unit 50R is provided on the right side as seen from the front bezel 43. That is to say, the sub-storage units 50L and 50R are provided symmetrically on the left and right, so as to divide the width dimension of the case 41 between left and right. It should be understood that, in the following explanation, if there is no need to distinguish between left and right sides, reference will simply be made to a sub-storage unit 50. Here, the right side of FIG. 5 is the front side of the high density type storage unit 40D, and here a plurality of hard disk drives 51 are shown. The region in the front side of the storage unit 40D corresponds to "the one region". And the left side in FIG. 5 is the rear side of the high density type storage unit 40D, and here a plurality of power supply devices 55 are provided. This rear region corresponds to "the other region".

The explanation will now concentrate upon the left side sub-storage unit 50L. An identification number is provided to each of the hard disk drives 51 which this sub-storage unit 50L possesses. These identification numbers are set so that their values become higher in order from the left side, as one faces the sub-storage unit 50L.

A total of four rows of hard disk drives 51 are provided to the sub-storage unit 50L, from its front towards its rear. The first row consists of a total of seven hard disk drives 51, from L#0 through L#6, while the second row consists of a total of seven hard disk drives 51, from L#7 through L#13. And the third row consists of a total of five hard disk drives 51, from L#14 through L#18, while the fourth row consists of a total of five hard disk drives 51, from L#19 through L#23.

The enclosures 52 (L#0) and 52 (L#1) are provided between the hard disk drives 51 of the third row and the fourth row. In concrete terms, the enclosure 52 (L#1) is provided between the hard disk drive 51 (L#15) and the hard disk drive 51 (L#16), and between the hard disk drive 51 (L#20) and the hard disk drive 51 (L#21). In a similar manner, the enclosure 52 (L#0) is provided between the hard disk drive 51 (L#16) and the hard disk drive 51 (L#17), and between the hard disk drive 51 (L#21) and the hard disk drive 51 (L#22).

Since the enclosures 52 are provided in the third row and the fourth row in this manner, the numbers of drives in the third row and in the fourth row are two less than the numbers of drives in the first row and in the second row.

If it were possible to provide the enclosures 52 in the first row and the second row, then the numbers of drives in the first row and in the second row would be two less than the numbers of drives in the third row and in the fourth row. However, if this structure were adopted, then the distance from the rear surface of the case 41 to the enclosures 52 would become too great. As described hereinafter with reference to FIG. 9, the cables 70 are inserted into the case 41 from the lower portion of the rear side of the case 41, and are connected to the enclosures 52 in a state of being attached by the cable holders 54. Accordingly, it is desirable for the enclosures 52 to be installed as far as possible towards the rear side of the case 41.

Figure 9:
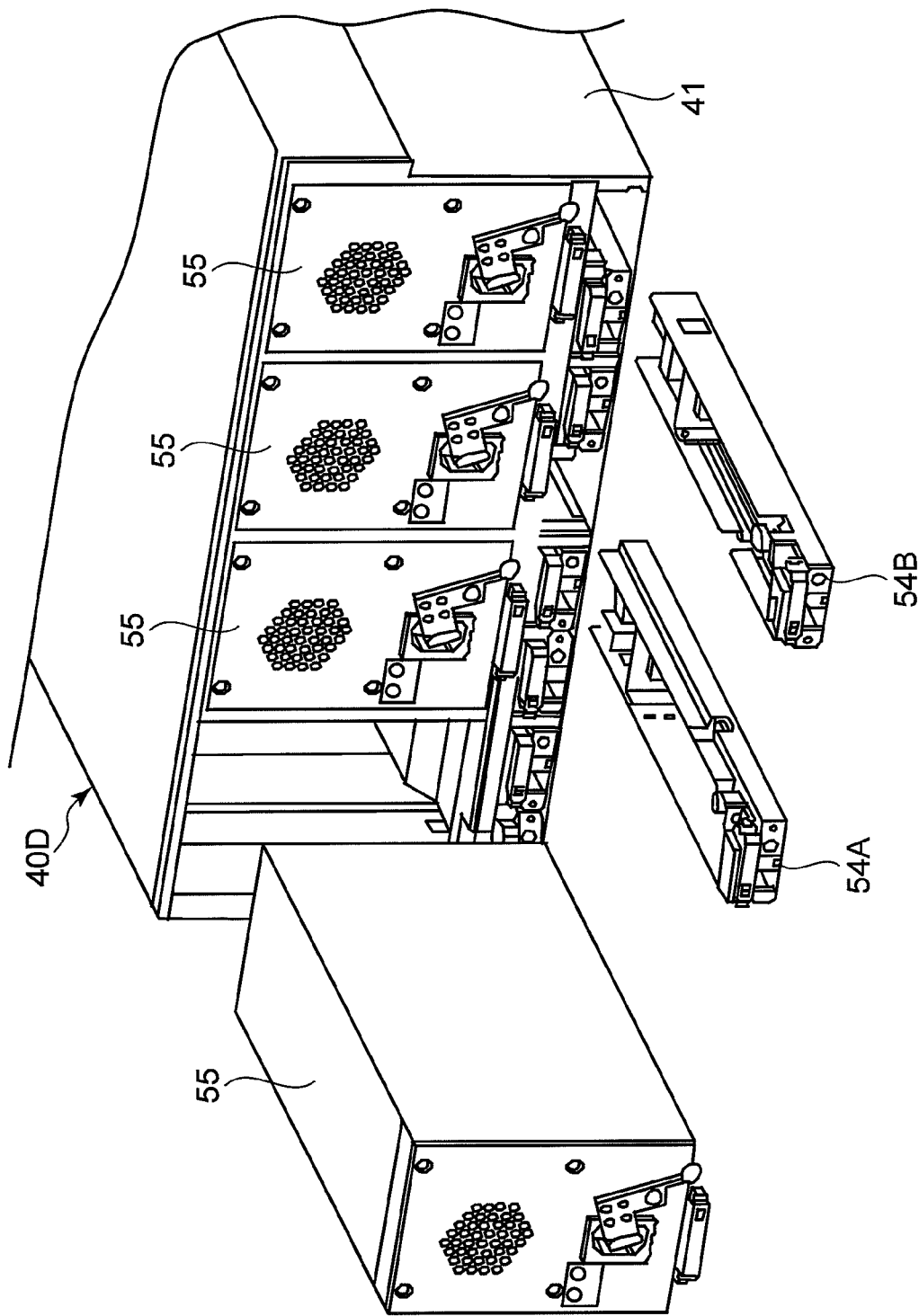
FIG. 9 is a perspective view of the storage unit as seen from its rear side.

On the other hand, the power supply devices 55 are provided towards the rearmost side of the case 41, so that it is possible to pull them out from the rear side of the case 41 (refer to FIGS. 5 and 9). Accordingly, the enclosures 52 are provided at approximately the central portion of the case 41, positioned more towards the front thereof than the power supply devices 55. To give attention to the relationships with the group of hard disk drives 51, the enclosures 52 are provided within the group of hard disk drives 51 in the rear rows thereof (the third row and the fourth row).

The above describes the structure of the left side sub-storage unit 50L. Since the right side sub-storage unit 50R has a structure similar to that of the left side sub-storage unit 50L, description thereof will be omitted. The above explanation may be used for explanation of the structure of the right side sub-storage unit 50R, with only "L#" being replaced by "R#".

FIG. 6 is an explanatory figure showing a storage unit management table T10 for managing the storage unit 40. This management table T10 may, for example, be stored within the memory 36 possessed by the controller 30.

This management table T10 may, for example, include a unit number field C10, a SAS address field C11, a manufacturing number field C12, a pair number field C13, a sub-storage unit type field C14, and a valid flag field C15.

A serial number for distinguishing each storage unit in the table T10 is stored in the unit number field C10. A SAS address which is provided to the storage unit 40 is stored in the SAS address field C11. And a manufacturing number which is provided to the storage unit 40 is stored in the manufacturing number field C12.

A pair number for distinguishing pairs which have been detected is stored in the pair number field C13. By a pair is meant a pair of sub-storage units 50L and 50R which belong to the same storage unit 40D. The controller 30 of the control unit 20 acquires the manufacturing numbers from each of the storage units 40 (including the sub-storage units 50), decides that units to which the same manufacturing number is set constitute a pair, and manages them accordingly.

The same manufacturing number is set to the sub-storage units 50L and 50R. Accordingly, the plurality of units which return the same manufacturing number to the controller 30 may be deemed to be a pair of sub-storage units 50L and 50R which are provided to the same high density type storage unit 40D. The controller 30 sets pair numbers in sequence to the pairs of sub-storage units 50L and 50R, in the order in which these pairs are found.

A value is stored in the valid flag field C15 which shows whether or not the contents registered in the management table T10 are correct according to predetermined rules. As the predetermined rules, there may be suggested: first, in the case of a high density type storage unit 40D, that it is possible to acquire a manufacturing number from each of the sub-storage units 50L and 50R, second, that the unit numbers are consecutive; third, that the unit numbers of the sub-storage units 50L and 50R within the same high density type storage unit 40D are consecutive; and fourth, that a right side sub-storage unit 50R is connected after a left side sub-storage unit 50L (and that, in the case of a high density type storage unit 40D being connected, connection initially starts from a left side sub-storage unit 50L).

If the contents of some row in the table T10 is correct, then data which specifies that this contents is valid (for example "OK") is stored in the valid flag field C15. But if the contents of this row is in violation of one of the rules above, then data which specifies that this contents is not valid (for example "NG") is stored in the valid flag field C15.

Figure 7:
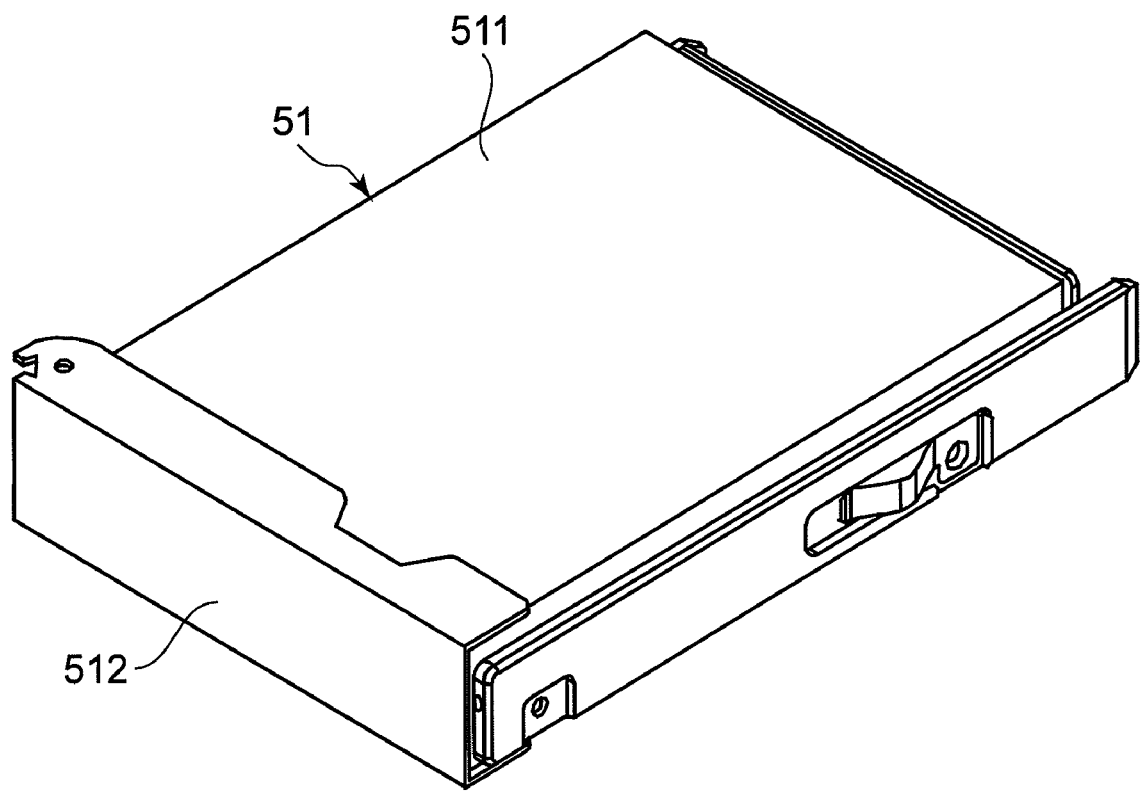
FIG. 7 is a magnified perspective view showing a hard disk drive.

FIG. 7 is an external view of one of the hard disk drives 51. This hard disk drive 51 comprises a drive main body 511 and a canister 512 which contains the drive main body 511. The canister 512 is formed so as not to cover over the entire drive main body 511, but so as only to cover over a portion of the surface of the drive main body 511.

Figure 8:
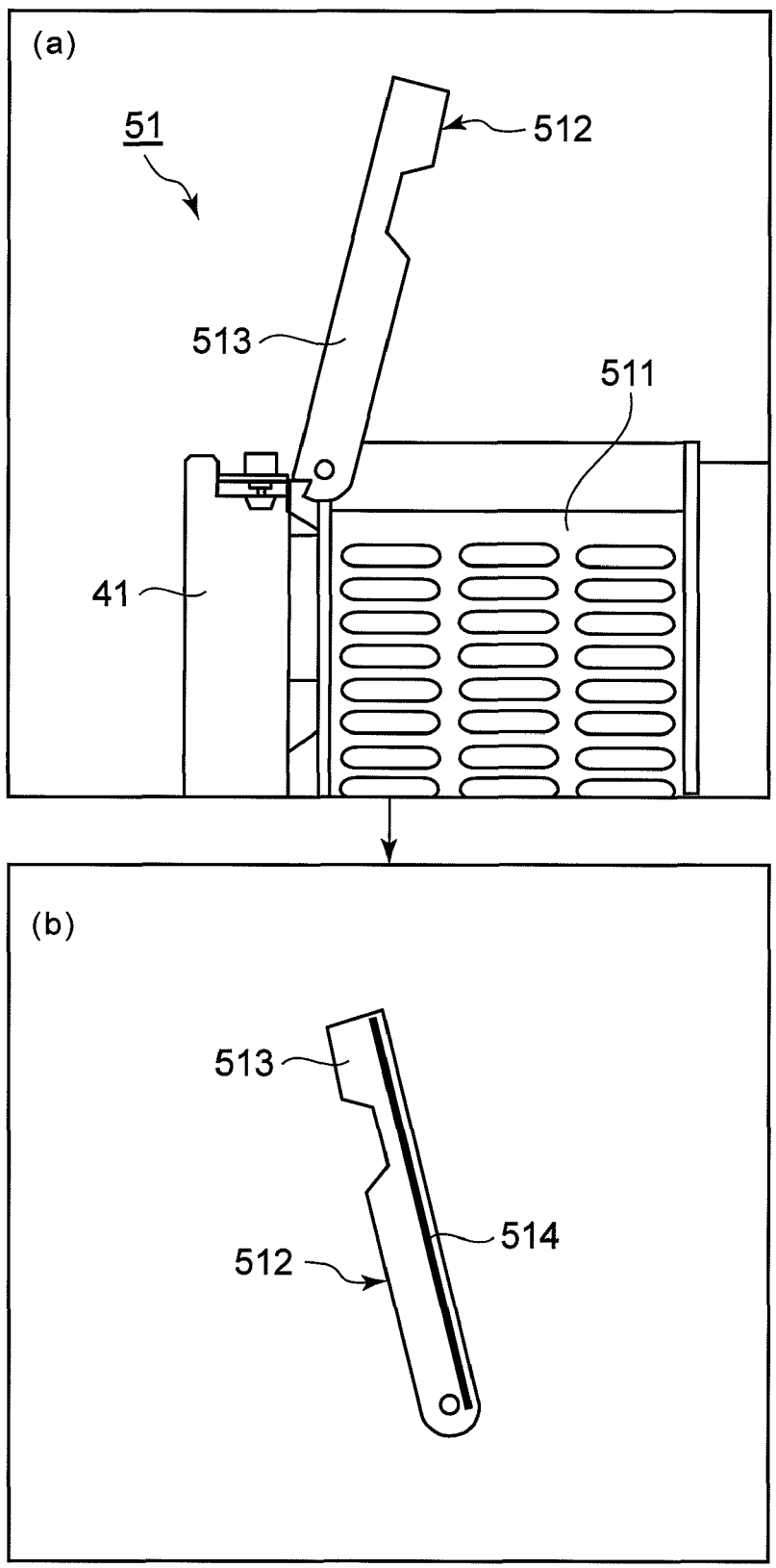
FIG. 8 is an explanatory figure showing (a) a state in which a hard disk drive is fitted to a case, and (b) a shield portion which is provided to the hard disk drive.

FIG. 8 is a magnified explanatory figure showing the way in which a hard disk drive 51 is fitted to the case 41. By grasping a lever 513 upon the hard disk drive 51, the user is able to take the hard disk drive 51 out from the case 41, and to put it back in, in a simple and easy manner. A first shield portion 514 is provided on one side of the lever 513. This first shield portion 514 may be made in the shape of a band from, for example, a material such as rubber or plastic or the like, and is attached to the lever 513 along almost its entire length. The role of this first shield portion 514 will be described hereinafter.

FIG. 9 is a perspective view of the high density type storage unit 40D as seen from its rear side. A plurality (for example four) of the power supply devices 55 are provided at the rear side of this high density type storage unit 40D, so as to be removable.

Moreover, cable holders 54A and 54B are provided at the lower sides of the power supply devices 55 so as to be removable (in the following, when these are not particularly to be distinguished, they will be simply referred to as cable holders 54). Cables 70 (refer to FIG. 3) are attached to the cable holders 54 so as to be removable. A cable 70 on the signal input side is attached to the cable holder 54A for input. And a cable 70 on the signal output side is attached to the cable holder 54B for output.

A cable 70 is attached to each of the cable holders 54, and, by the cable folder with this cable 70 attached thereto being inserted into a gap between the power supply device 55 and the case 41, the cable 70 can be attached to a connector of an enclosure 52.

Figure 10:
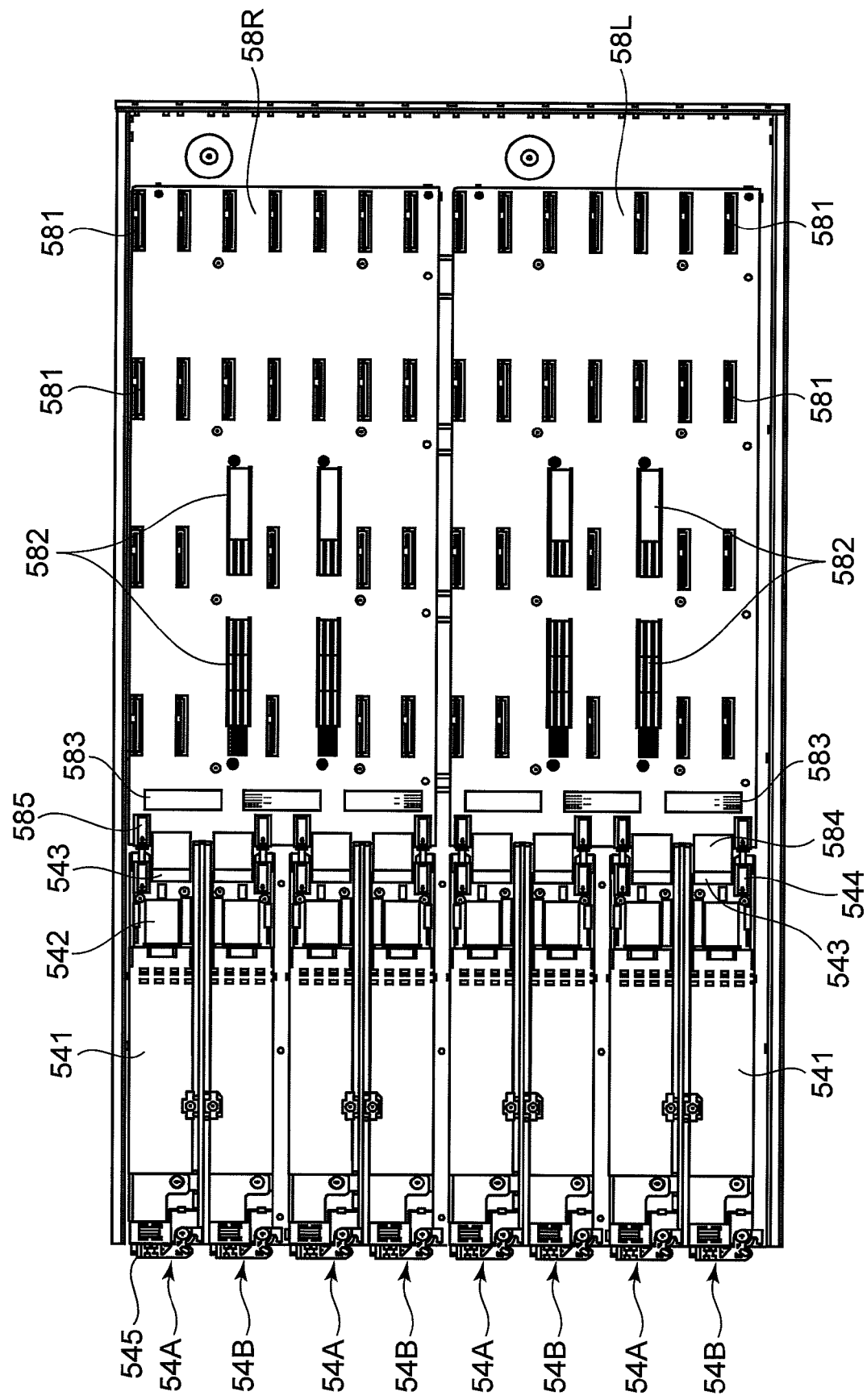

FIG. 10 is a plan view showing the structure of a printed circuit board 58. Drive connectors 581 for attachment to the hard disk drives 51, enclosure connectors 582 for attachment to the enclosures 52, and connectors 583 for attachment to a circuit board for power supply connection (not shown in the figures), are provided to this printed circuit 58 (58 is used as a generic term for 58L and 58R). The drive connectors 581 and the enclosure connectors 582 are provided in parallel to the vertical direction in FIG. 10, while the connectors 583 which correspond to the power supply devices 55 are provided along the horizontal direction in FIG. 10. To put this in another manner, the drive connectors 581 and the enclosure connectors 582 are provided parallel to the longitudinal direction of the printed circuit board 58, while the connectors 583 which correspond to the power supply devices 55 are provided parallel to the short side of the printed circuit board 58, thus being orthogonal to the direction of extension of the connectors 581 and 582.

Figure 11:
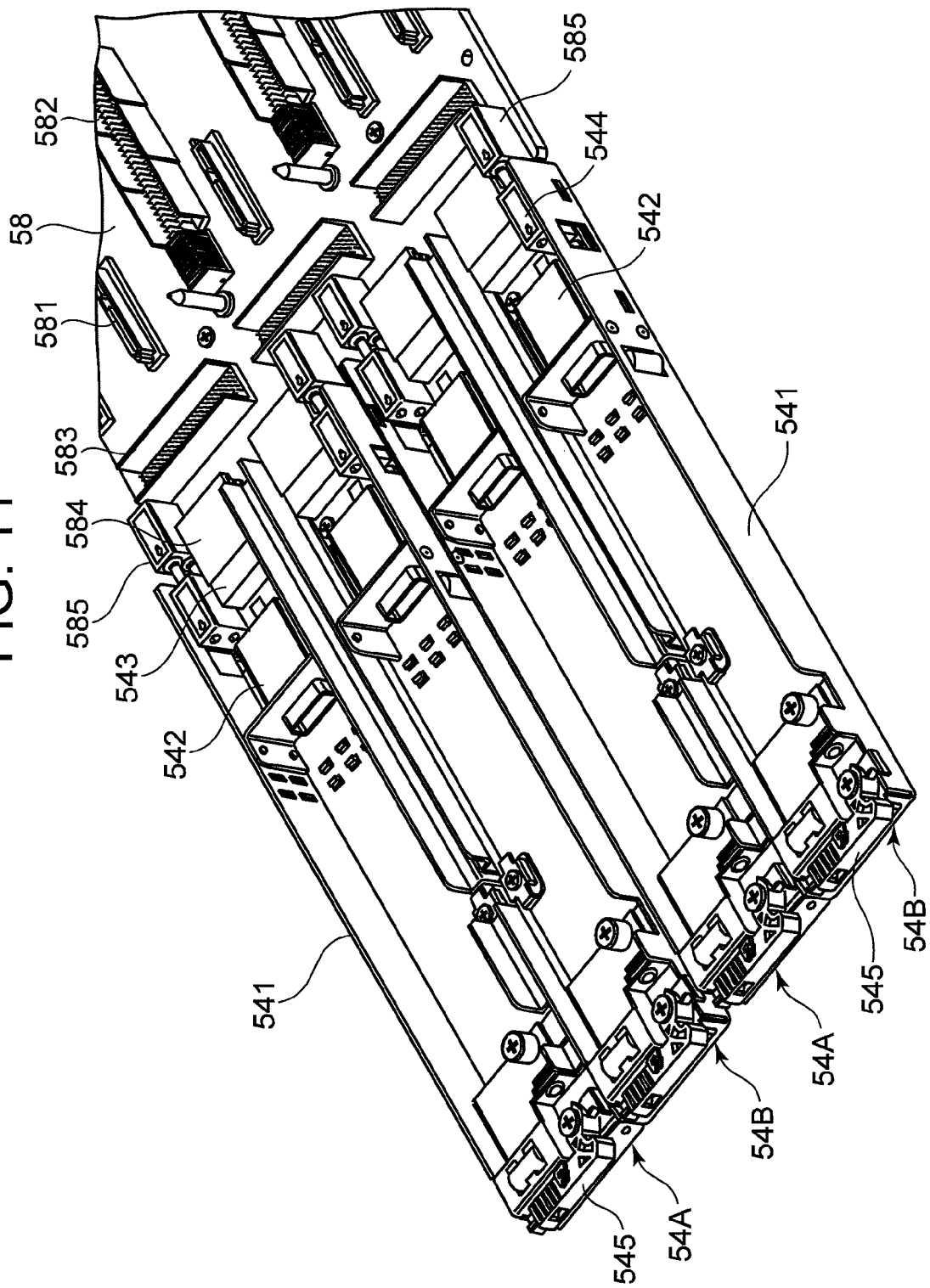
FIG. 11 is a magnified perspective view showing cable holders.

FIG. 11 is a magnified perspective view showing the cable holders 54A and 54B of one of the sub-storage units 50. Each of these cable holders 54A and 54B, for example, comprises a rectangular shaped case 541 whose upper surface is open, a connector 542 provided at one end of this case 541, another connector 543 which is electrically connected to this connector 542, a guide portion 544 provided in the vicinity of this connector 543, and a grip portion 545 which is provided at the base end side of the case 541 so as to be rotatable.

One end of a communication cable 70 is inserted into and attached to the connector 542. The connector 542 and the other connector 543 are electrically connected together by wiring not shown in the figures. Thus, by the connector 543 being connected to a connector 584 upon the printed circuit board 58, the communication cable 70 and the enclosure 52 are electrically connected together. As shown in FIG. 11, the cable holder for input 54A and the cable holder for output 54B are formed in mutually different shapes. As seen from the rear, the guide portions 544, which have projections, are formed upon the left side of the cable holder for input 54A and on the right side of the cable holder for output 54B. Moreover, the connectors 543 are provided on the ends of the cable holders 54A and 54B, in positions next to these guide portions 544.

Thus, the positions of the guide portions 544 and the positions of the connectors 543 are different between the cable holder for input 54A and the cable holder for output 54B. Accordingly it is possible to prevent a fitting mistake, even if the cable holder for output 54B should be inserted into the place in which the cable holder for input 54A should be inserted, or if the opposite error should happen. This is because, even if the cable holder 54A or 54B should be inserted into the wrong place, it cannot be attached in the normal manner.

By contrast, when the cable holder 54A or 54B is inserted into the case 41 in its predetermined position, then the projection of the guide portion 544 is connected into the aperture of a guide portion 585, so that the position of the cable holder 54A or 54B is fixed. When these two guide portions 544 and 545 are thus mechanically connected together, the connector 543 is attached to the connector 584, so that the communication cable 70 and the enclosure 52 are electrically connected together. The structure of the printed circuit board 58 will now be explained with reference to FIGS. 10 and 11. A plurality of guide portions 585 are provided at the rear edge of this printed circuit board 58, respectively corresponding to the guide portions 544. Apertures are formed in these guide portions 585, corresponding to the projections of the guide portions 544.

Moreover, connectors 584 which correspond to the connectors 543 are provided on the rear edge of the printed circuit board 58, at positions in the vicinity of the guide portions 585. These connectors 584 are connected to the enclosure 52 via printed wiring upon the printed circuit board 58.

Figure 12:
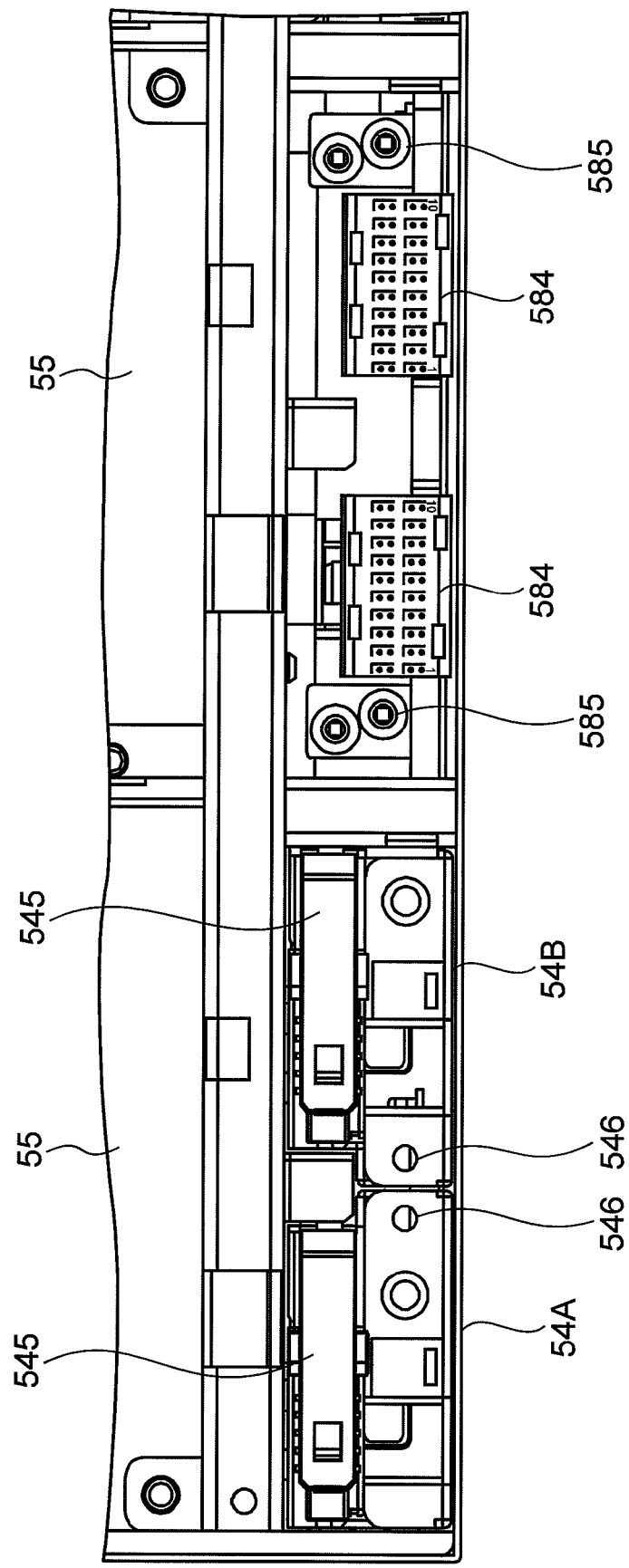

FIG. 12 is a magnified explanatory figure showing the rear surface of the high density storage unit 40D. On the left side in FIG. 12, the state is shown in which the cable holders 54A and 54B are attached, while on the right side in FIG. 12, the state is shown in which the cable holders 54A and 54B have been taken off.

As shown in FIG. 12, grip portions 545 are provided on the rear ends of the cable holders 54A and 54B. By the user pulling the grip portion 545 towards him, i.e. grasping and pulling upon the grip portions 545, he can pull the cable holders 54A and 54B out from within the case 41. Moreover, LED lamps 546 are provided upon the rear surfaces of the cable holders 54A and 54B. These lamps 546 correspond to the enclosure 52 to which the cable holders 54A and 54B are connected. If the enclosure 52 suffers a fault or the like, then the corresponding lamps 546 are illuminated and blink.

Figure 13:
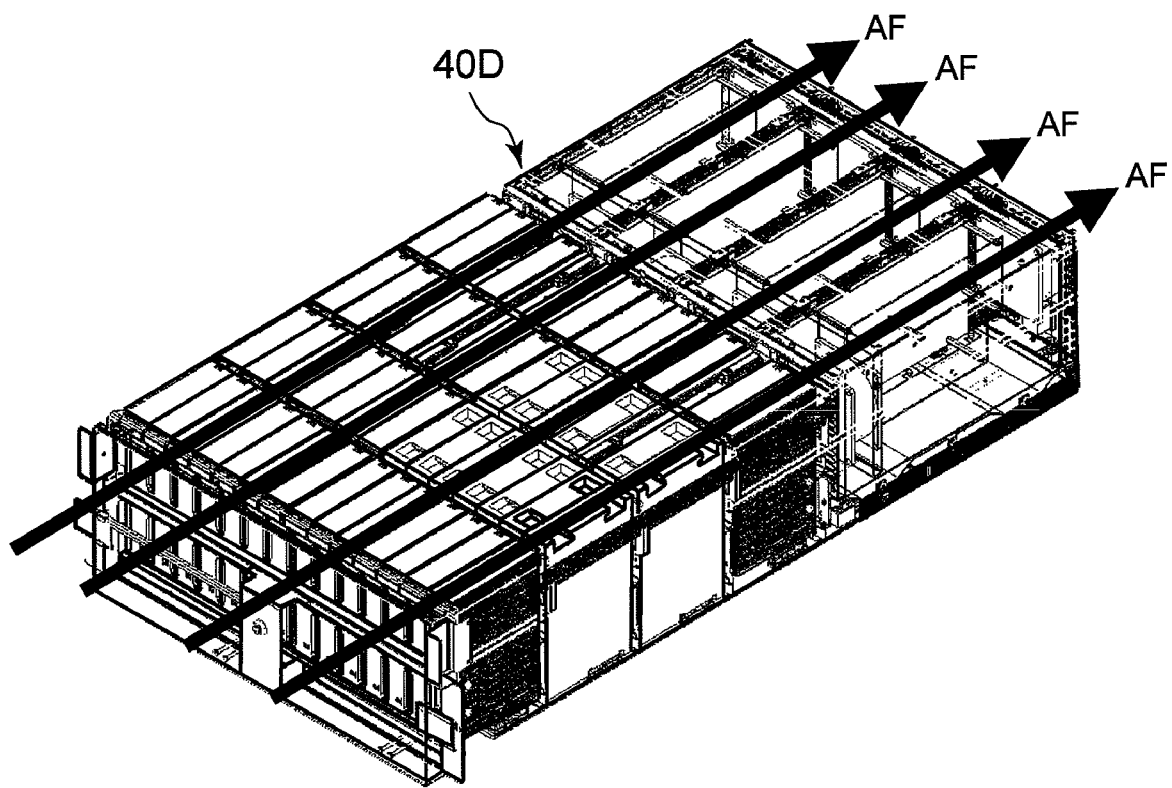
FIG. 13 is an explanatory figure showing the general structure of cooling air draft passages within a storage unit.

FIG. 13 is an explanatory figure showing the general structure of cooling air draft passages AF in a storage unit 40D. In FIG. 13, the state is shown in which the front bezel 43 and so on have been removed. In this embodiment, a plurality of cooling air draft passages AF are provided, extending parallel to the case 41 from the front of the storage unit 40D towards its rear.

Figure 14:
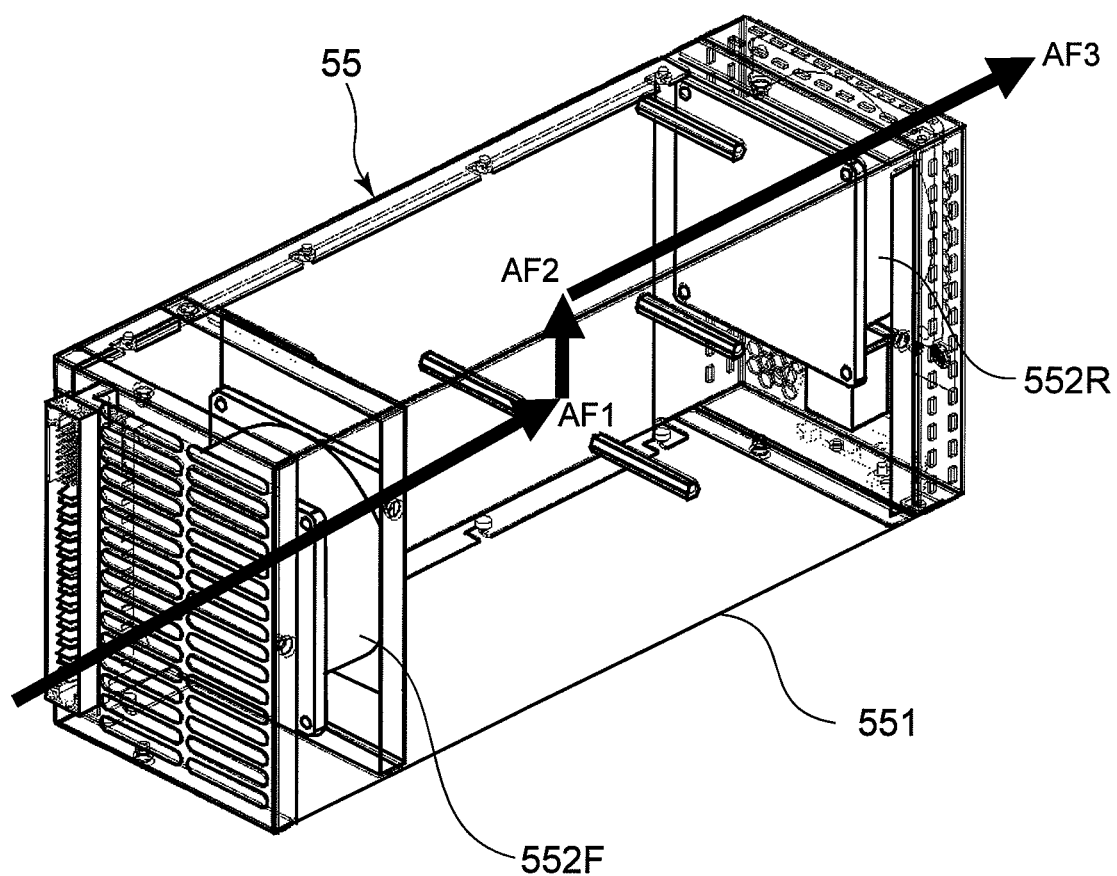
FIG. 14 is an explanatory figure showing a cooling structure within a power supply device.

FIG. 14 is an explanatory figure showing the cooling structure within one of the power supply devices 55. Respective cooling fans 552F and 552R are provided at the front side and the rear side of the casing 551 of this power supply device 55. Each of these cooling fans 552F and 552R has the same structure, and they rotate in the same direction.

When these cooling fans 552F and 552R rotate, air is sucked in from the front side of the case 41. While flowing through the gaps between the hard disk drives 51, and through the gaps between the enclosures 52 and the hard disk drives 51, this air takes heat away from the hard disk drives 51 and from the enclosures 52, then flowing into the power supply devices 55.

And this air which has flowed into the power supply device 55 is discharged to the exterior from the rear side cooling fan 552R, after having flowed through cooling air draft passages AF1, AF2, and AF3 which are internal to the casing 551, and having cooled the interior of the power supply device 55. Thus, by providing the cooling fans 552F and 552R separately at the front and the rear of the power supply device 55, it is possible to increase the amount of the cooling air draft.

Figure 15:
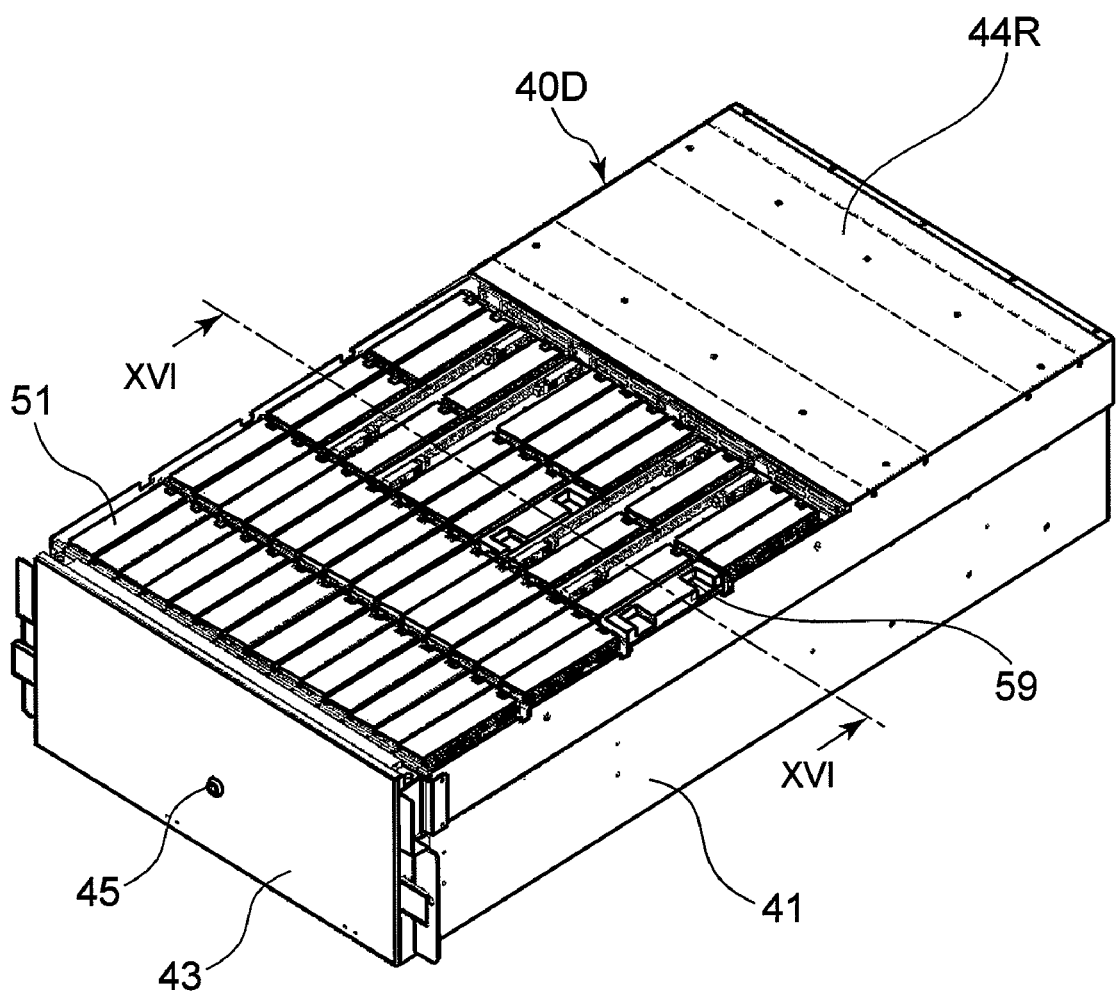
FIG. 15 is a perspective view of a storage unit, for explaining the structure of a shield portion thereof.

A structure by which the cooling air draft passages AF are shielded even when the cover 44F has been taken off will now be explained with reference to FIGS. 15 through 17. FIG. 15 is a perspective view of the storage unit 40D. This storage unit 40D includes a dummy module 59.

This dummy module 59 is a unit which is fitted into the case 41 instead of a hard disk drive 51, and is formed in a shape which closely resembles a hard disk drive 51 from a material such as, for example, plastic or the like. In other words, this dummy module 59 is used purely for occupying space in which a hard disk drive 51 should be mounted, and thus is not endowed with any function of providing storage.

Figure 16:
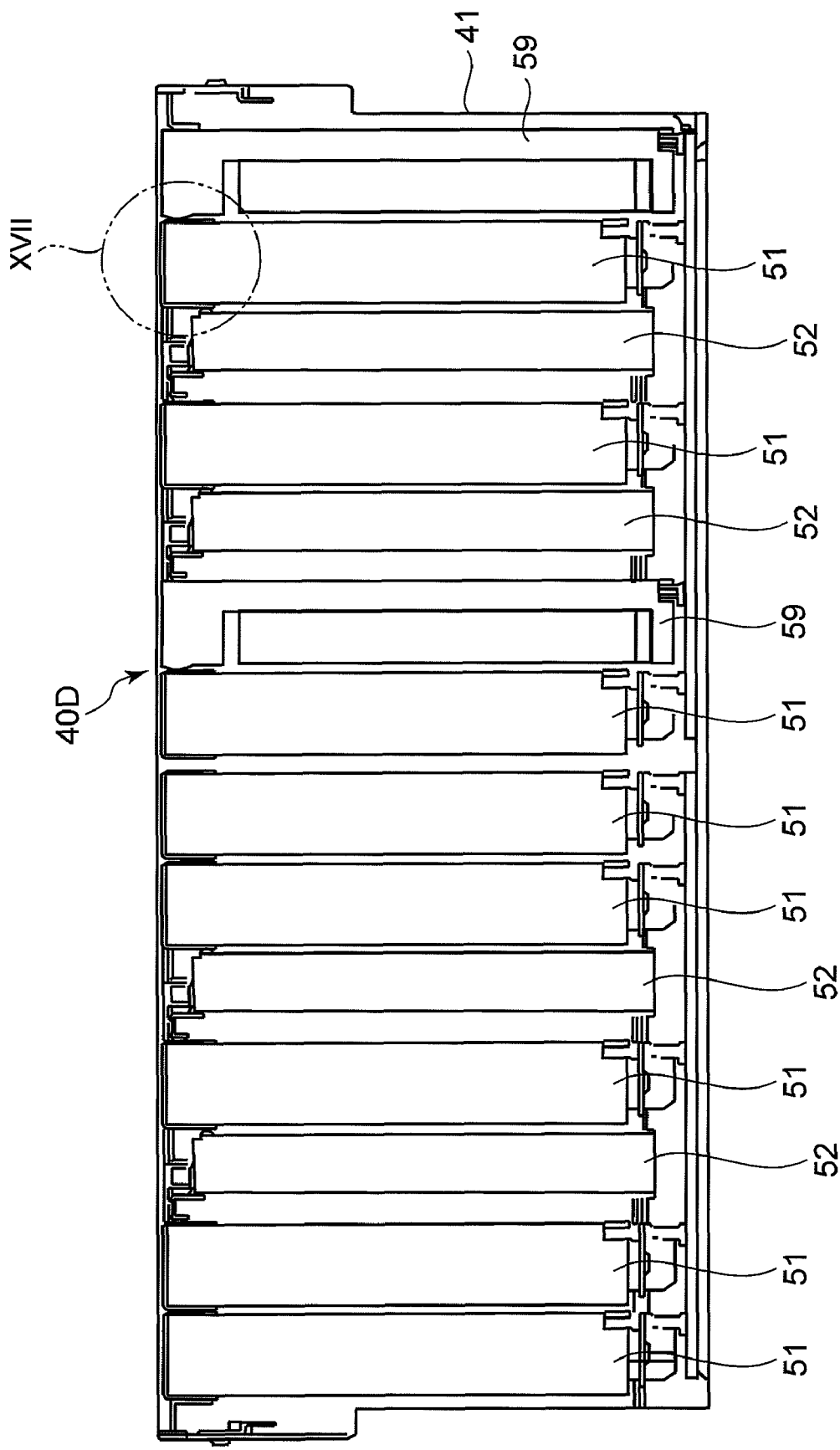
FIG. 16 is a sectional view taken through FIG. 15 along the line shown by the arrows XVI-XVI.

FIG. 16 is a sectional view taken through FIG. 15 along the line shown by the arrows XVI-XVI. In FIG. 16, for convenience, cross-sectional hatching is omitted. In the example shown in FIG. 16, in order from the right side in the third row, there are arranged a dummy module 59, a hard disk drive 51, an enclosure 52, a hard disk drive 51, an enclosure 52, another dummy module 59, and a hard disk drive 51. FIG. 17 is a sectional view showing the region XVII in FIG. 16 in magnified view.

Figure 17:
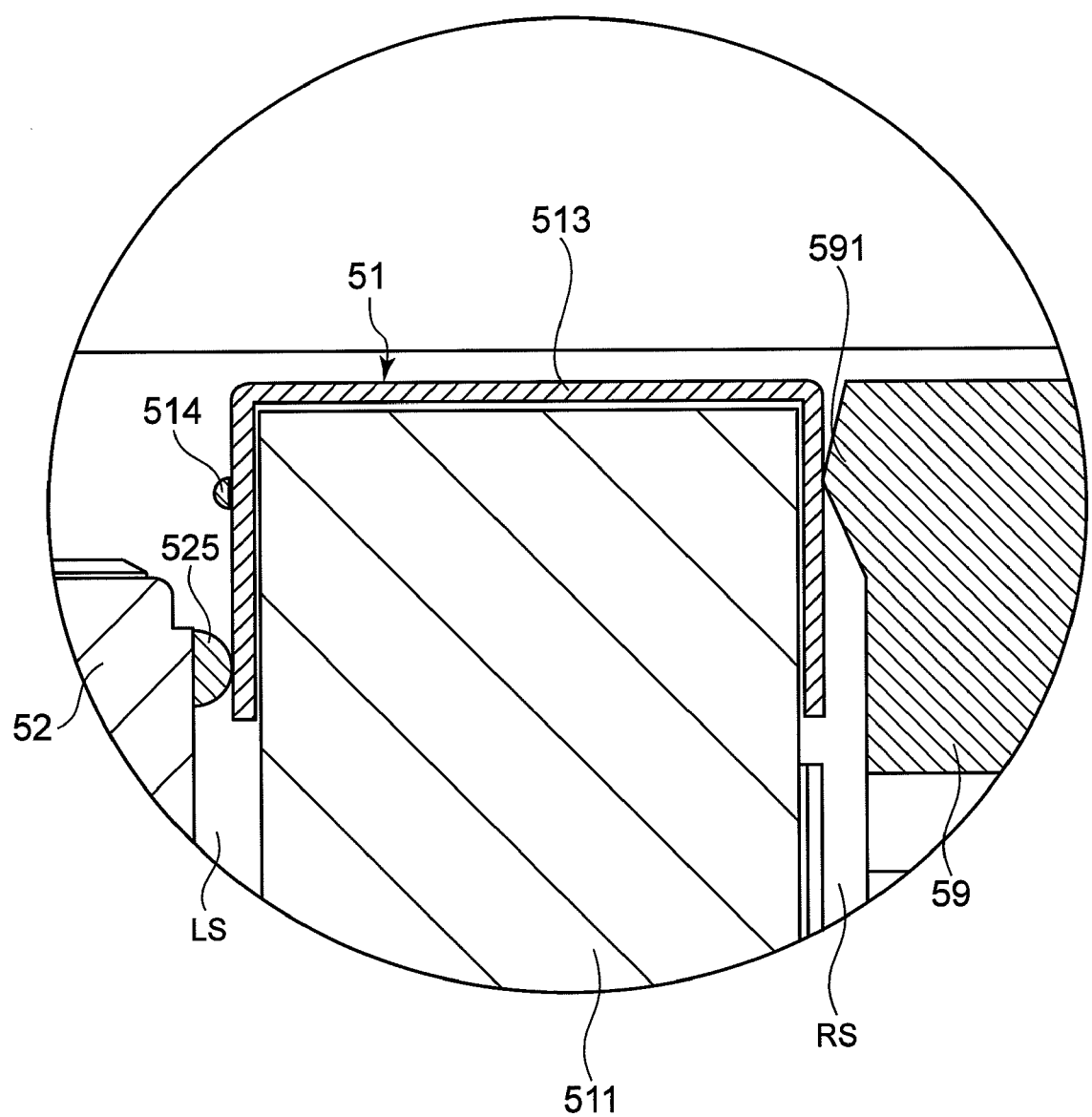
FIG. 17 is a magnified sectional view of a region XVII in FIG. 16.

Second shield portions 525 which are made from, for example, rubber or plastic or the like, are provided on both the side surfaces of the enclosures 52 (only the second shield portion 525 on the left side can be seen in FIG. 17). Moreover, a third shield portion 591 is provided integrally upon one side surface of the dummy module 59 (its left side surface in FIG. 17). Furthermore, as described above, the first shield portions 514 are provided upon the one surfaces of the levers 513 of the hard disk drives 51.

The gap RS between the hard disk drive 51 and the dummy module 59 constitutes a portion of the cooling air draft passage AF. The upper side of the interior of this gap RS is closed by the third shield portion 591 contacting against the lever 513 of the hard disk drive 51. Accordingly, the flowing of external air into this gap RS from above the case 41 can be suppressed or stopped.

Moreover, the gap LS between the hard disk drive 51 and the enclosure 52 constitutes a portion of the cooling air draft passage AF. The upper side of this gap LS is closed by the second shield portion 525 contacting against the lever 513 of the hard disk drive 51. Accordingly, the flowing of external air into this gap LS from above the case 41 can also be suppressed or stopped.

It should be understood that, at the portion where two of the hard disk drives 51 adjoin one another, the first shield portion 51 possessed by one of the hard disk drives 51 contacts against the level 513 of the other hard disk drive 51, which is adjacent to it. Due to this, it is possible to close the upper side of the gap between these two hard disk drives 51, so that it is possible to suppress and prevent flowing of air into this gap from above the case 41.

Figure 18:
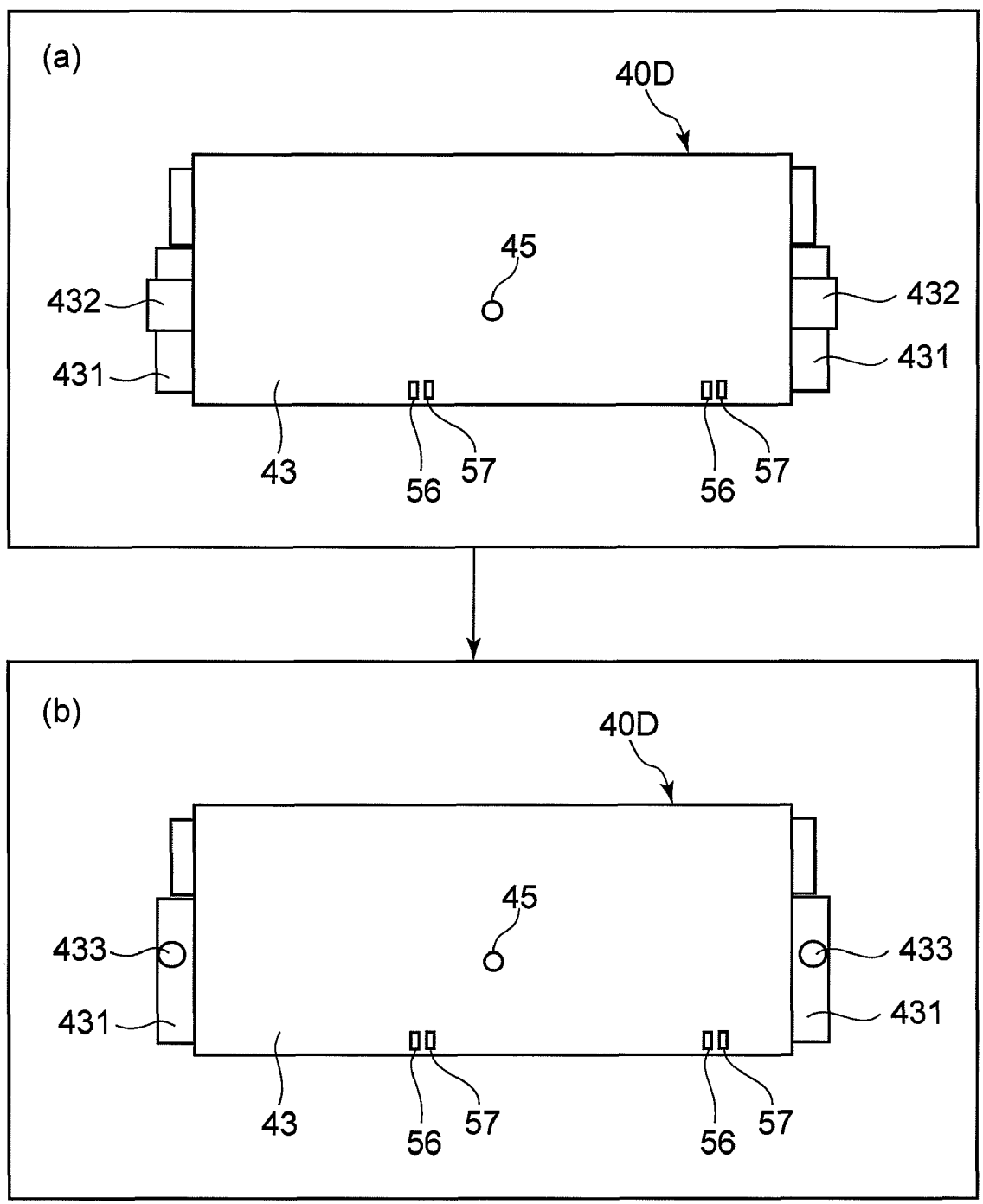
FIG. 18 is an elevation view of a storage unit, for showing the operation of a shield plate.
Figure 19:
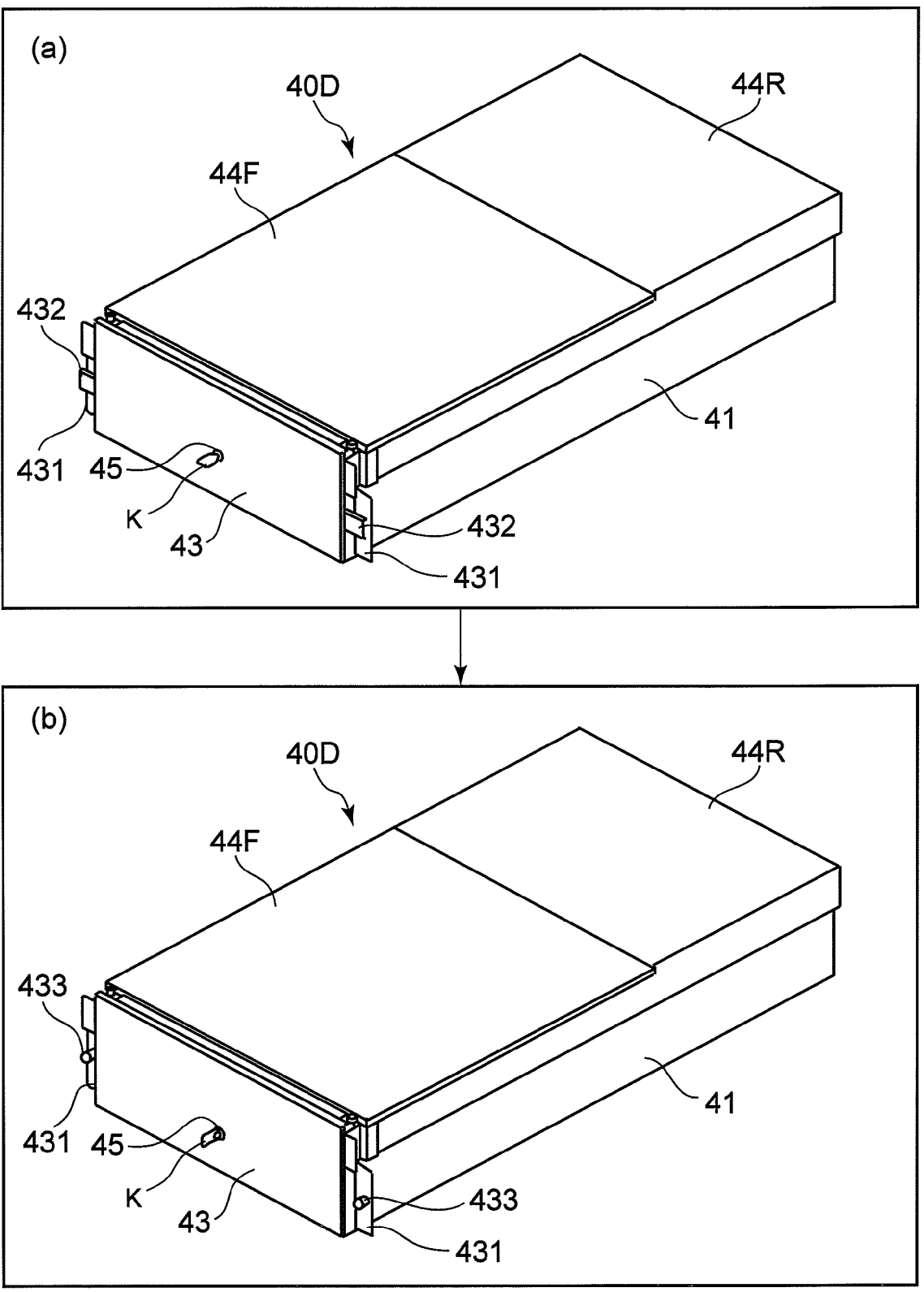
FIG. 19 is a perspective view of the storage unit, for showing the operation of the shield plate.

A structure for enhancing the security of the storage unit 40D during maintenance will now be explained on the basis of FIGS. 18 through 26. FIGS. 18 through 22 show a method for attaching the storage unit 40D to the rack 11 safely. FIG. 18 is an explanatory figure showing the storage unit 40D from the front. And FIG. 19 is a perspective view of the storage unit 40D, in its state in which the lock device 45 is unlocked.

FIGS. 18(a) and 19(a) show the case in which the lock device 45 is locked. The lock device 45 is locked up by the user inserting a key K into the lock device 45 and rotating it in the locking up direction. In the locked up state the shield plate 432, which serves as a "shield portion", projects from both the front side portions of the case 41 (i.e. from both sides of the front bezel 43), and covers over and hides the fitting screws 433. Accordingly, it becomes difficult for the user to operate the fitting screws 433.

Here, it is acceptable to provide a structure in which the shield plate 432 perfectly prevented operation of the fitting screws 433, and it is also acceptable to provide a structure in which the shield plate 432 only somewhat hampers the operation of the fitting screws 433 to a certain extent.

FIGS. 18(b) and 19(b) show the state in which the lock device 45 has been unlocked. The lock device 45 is unlocked by the user inserting the key K into the lock device 45 and rotating it in the unlocking direction. In the unlocked state, the shield plate 432 is received within the case 41, and the fitting screws 433 are exposed to the exterior. Accordingly, by the user pinching and rotating the fitting screws 433, he is able to release the fixing of the storage unit 40D in the rack 11, and, conversely, he is able to fix the storage unit 40D back into the rack 11.

FIG. 20 is a figure showing the relationship between the lock device 45 and the shield plate 432. FIG. 20(a) shows the locked state, while FIG. 20(b) shows the unlocked state. Links 451 which extend from both sides of the lock device 45 are linked to the shield plates 432. According to the state of the lock device 45, these links 451 are extended or retracted. In the locked state, as shown in FIG. 20(a), the links 451 are extended, and the shield plates 432 cover over and hide the fitting screws 433. And, in the unlocked state, as shown in FIG. 20(b), the links 451 are shortened, and the shield plates 432 are contained within the case 41.

Since the lock device 45 and the shield plates 432 are connected together via the links 451, as described above, the positions of the shield plates 432 are changed according to the locking or unlocking state. To put this in another manner, if the shield plates 432 are not operating normally, it is not possible to unlock the lock device 45.

Figure 21:
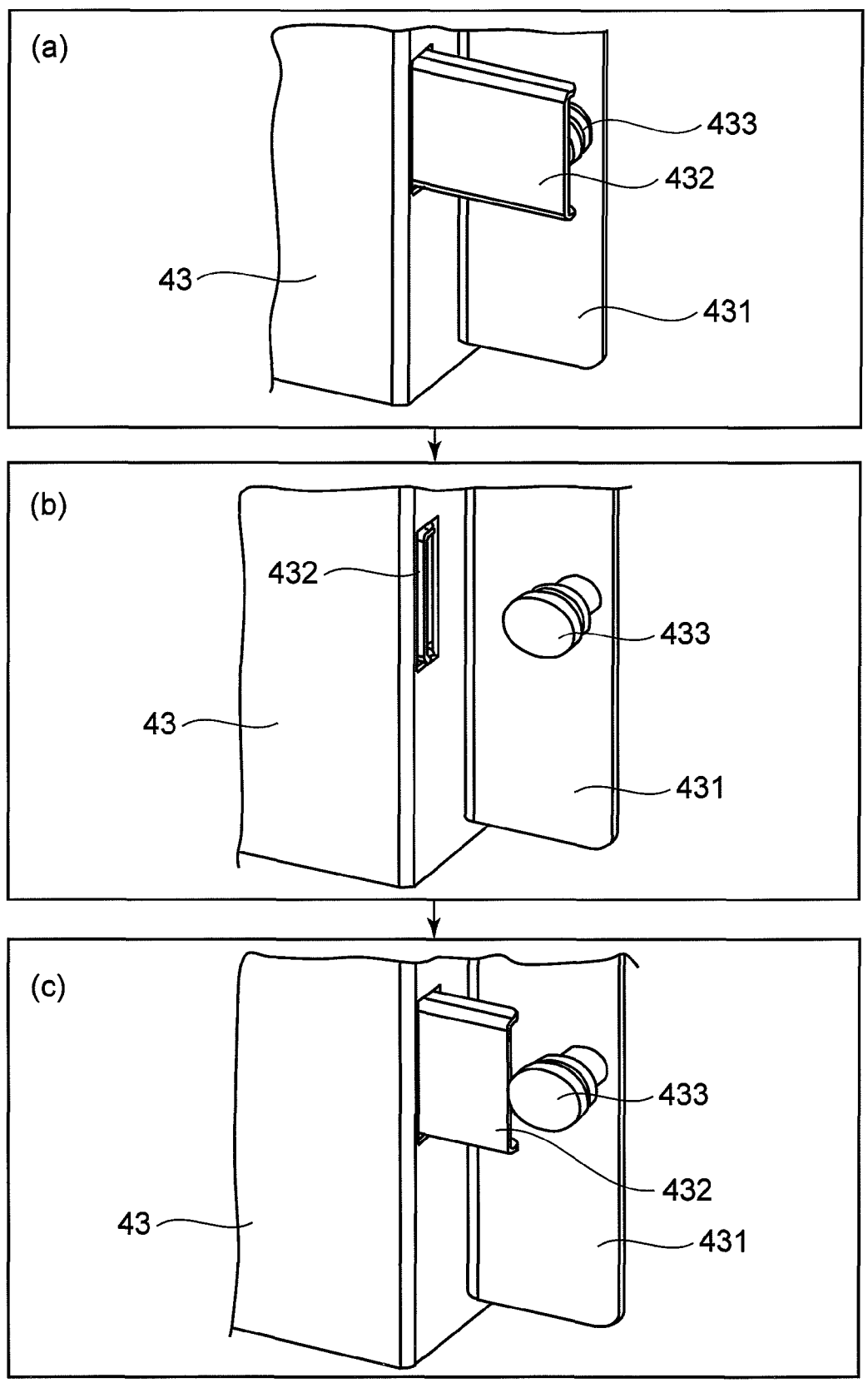
FIG. 21 is an explanatory figure showing the relationship between the shield plate and a fixing screw.
Figure 22:
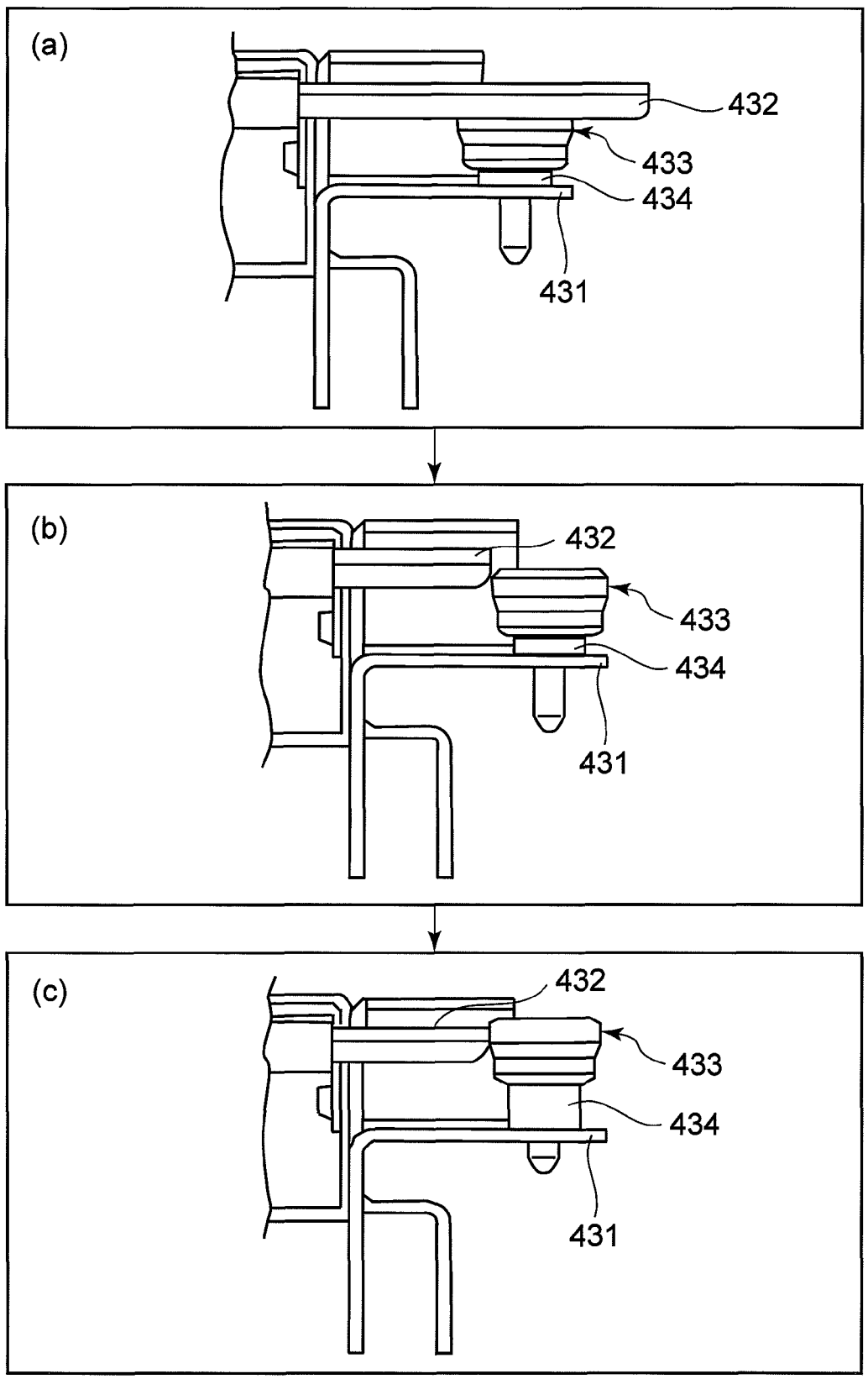
FIG. 22 is an explanatory figure showing FIG. 21 as seen from the side.

FIG. 21 is an explanatory figure showing the relationship between one of the shield plates 432 and one of the fitting screws 433, and FIG. 22 is an explanatory figure showing FIG. 21 as seen from the side. FIGS. 21(a) and 22(a) show the locked state.

In the locked state, the shield plates 432 project and cover the fitting screws 433. The fitting screws 433 are provided with springs 434. The user attaches the fitting screws 433 into screw holes of stays 431 against the biasing spring force of the springs 434. The stays 431 are fixed to the case 41. Via the stays 431 and the fitting screws 433, the storage unit 40D is fixed to the rack 11.

After the storage unit 40D has been fixed to the rack 11, when the user locks the lock device 45, as shown in FIGS. 21(a) and 22(a), the shield plates 432 project and cover over and hide the heads of the fitting screws 433.

When the storage unit 40D is pulled out from the rack 11, the user inserts the key into the lock device 45 and unlocks it. Due to this, as shown in FIGS. 21(b) and 22(b), the shield plates 432 are retracted within the case 41, and the fitting screws 433 are exposed. Then the user operates the fitting screws 433 which have been exposed, and loosens them. When the fitting screws 433 are loosened, the springs 434 expand, and the fitting screws 433 become projected.

The case will now be investigated in which, when the storage unit 40D is fixed to the rack 11, the fitting screws 433 have not been sufficiently tightened. In this case, due to the spring force of the springs 434, the fitting screws 433 project to the outside more than in their state in which they are normally tightened. Accordingly, as shown in FIGS. 21(c) and 22(c), even if the user tries to lock up the lock device 45, the shield plates 442 contact against the fitting screws 433, and it is not possible to perform the locking process further, since further displacement of the shield plates 442 is prevented. Due to this, the user notices that the tightening up of the fitting screws 433 has not been sufficiently performed.

Figure 23:
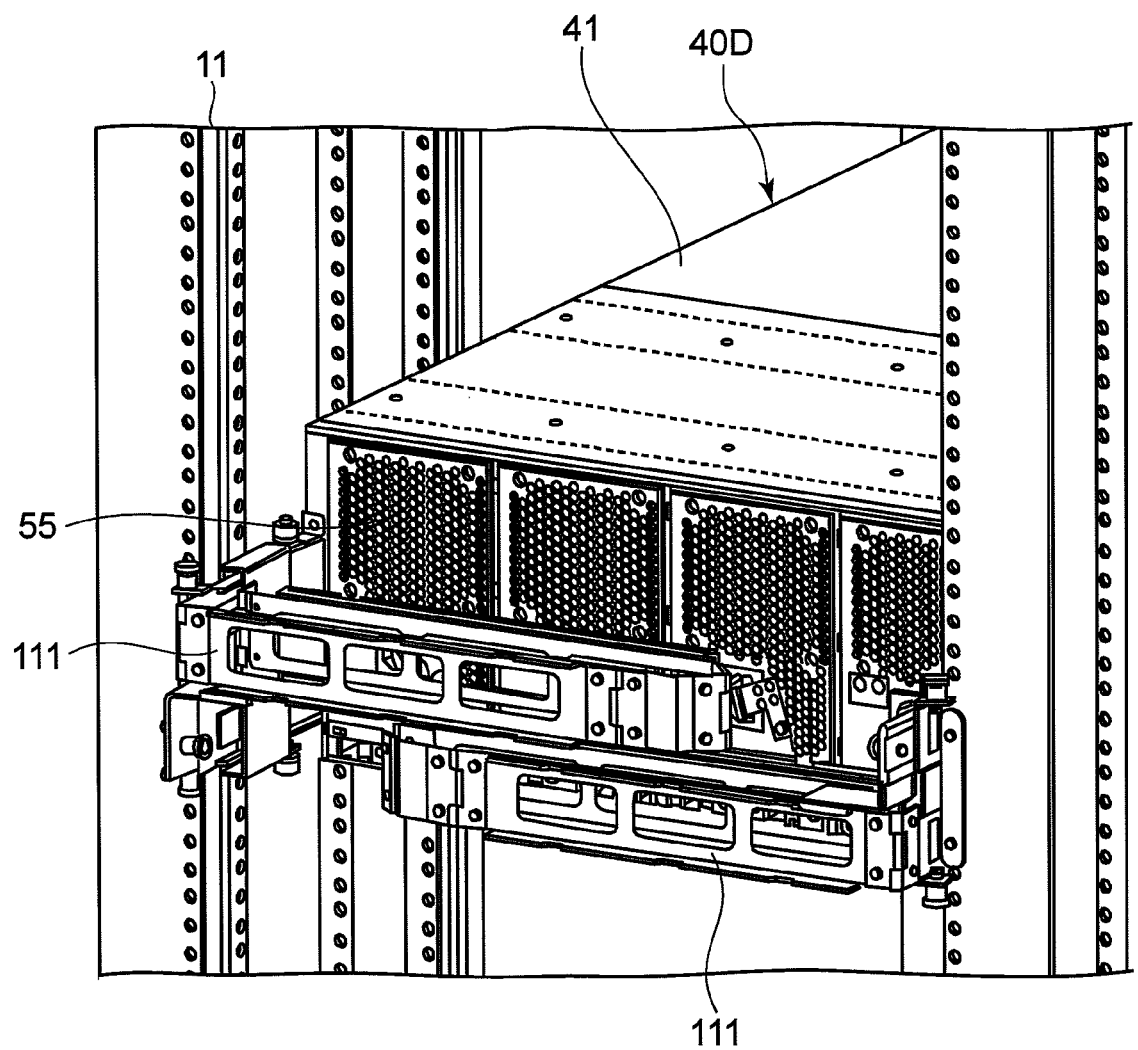
FIG. 23 is a perspective view showing the state in which the storage unit is fitted to a rack, as seen from the rear.

FIG. 23 is a perspective view as seen from the rear, showing the state in which the storage unit 40D is fitted to the rack 11. Pantograph members 111 are provided to the rack 11. These pantograph members 11 are shiftably attached to the rails 42. When the storage unit 40D is perfectly contained within the rack 11, as shown in FIG. 23, the pantograph members 111 are folded up, and are positioned behind the rear surface of the storage unit 40D.

Figure 24:
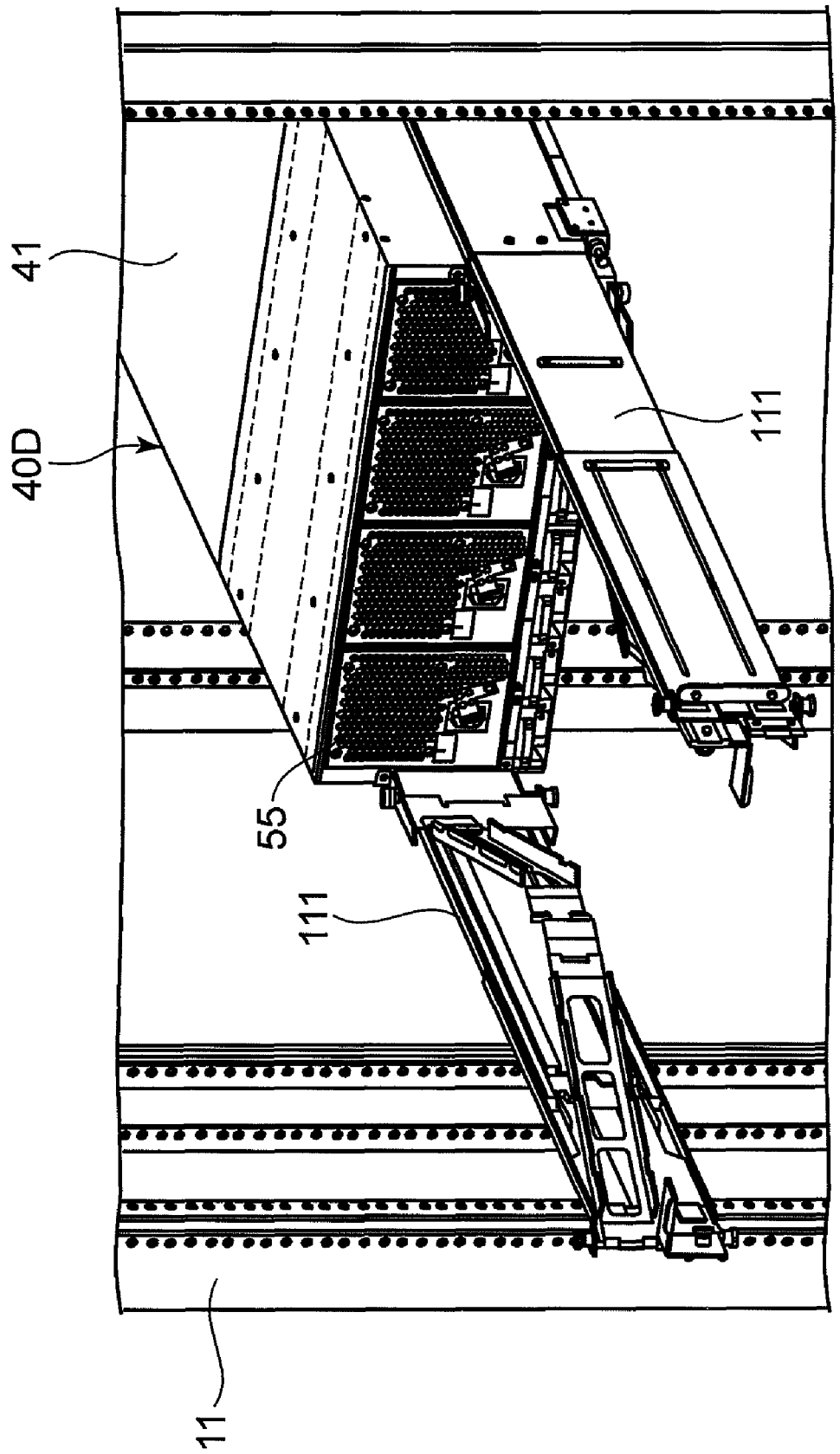
FIG. 24 is a perspective view showing the state in which the storage unit is pulled out from the rack, as seen from the rear.

FIG. 24 is a perspective view as seen from the rear, showing the state in which the storage unit 40D is pulled out from the front of the rack 11. In this case, the pantograph members 111 change from the folded up state to the flat state. Due to this, the rear surface of the storage unit 40D is exposed.

Figure 25:
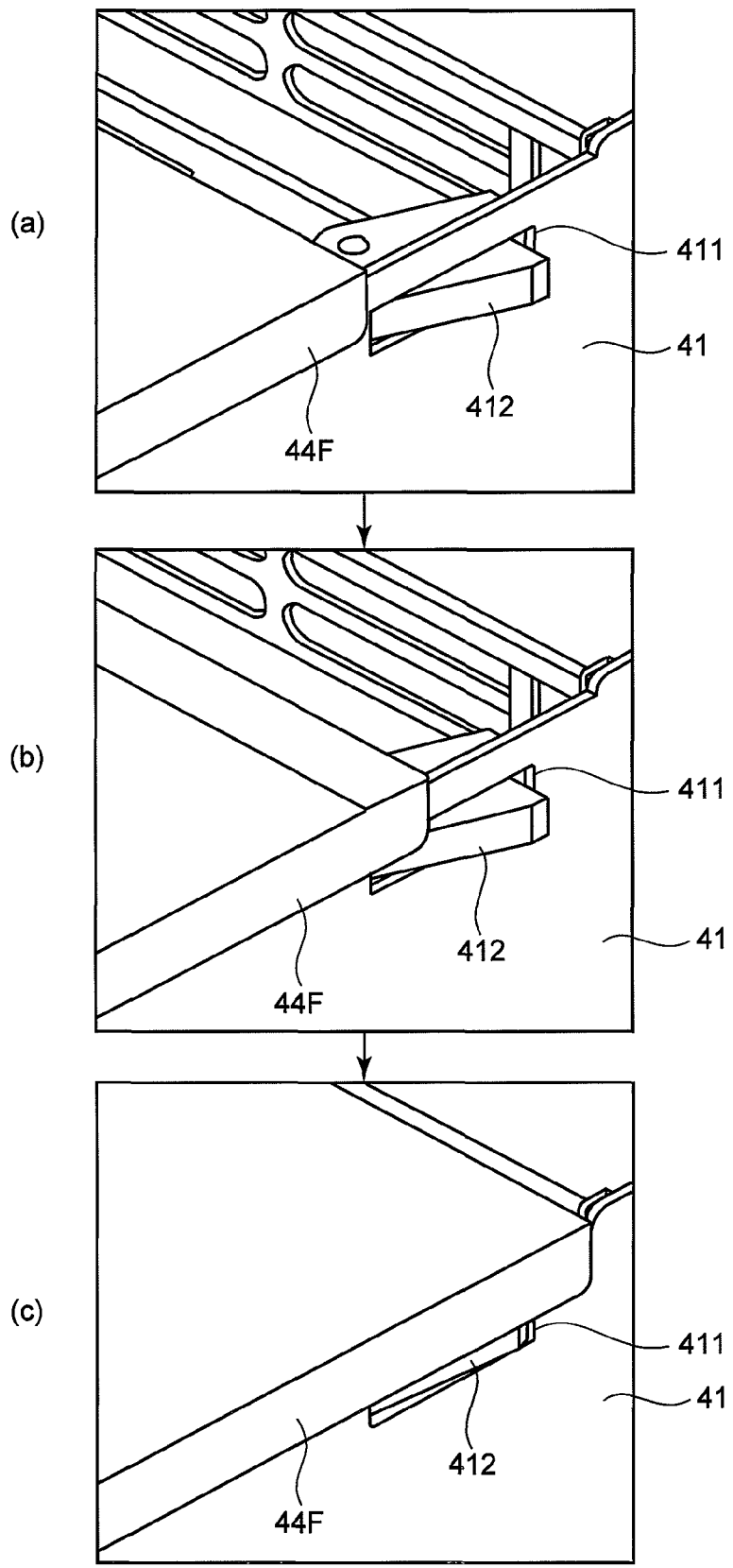
FIG. 25 is an explanatory figure showing the operation of a movable stopper.

FIG. 25 shows the structure of a movable stopper 412 which is provided to the case 41. This movable stopper 412 corresponds to the "stopper unit". The movable stopper 412 is attached to a rotation pin via a spring (neither of these is shown in the figures).

The movable stopper 412 projects to the exterior of the case 41 via an opening portion 411 which is formed in the case 41. The movable stopper 412 is positioned in the vicinity of the boundary between the front cover 44F and the rear cover 44R, and is provided slightly to the rear of the central portion of the case 41. Moreover, the movable stopper 412 is always biased by a spring in the direction to project to the exterior of the case 41.

FIG. 25(a) shows the state in which the cover 44F is not covering the movable stopper 412. And FIG. 25(b) shows the case in which the cover 44F has started to cover the movable stopper 412. Moreover, FIG. 25(c) shows the case in which the cover 44F is fitted normally to the case 41, so that the movable stopper 412 is covered over by the cover 44F.

Figure 26:
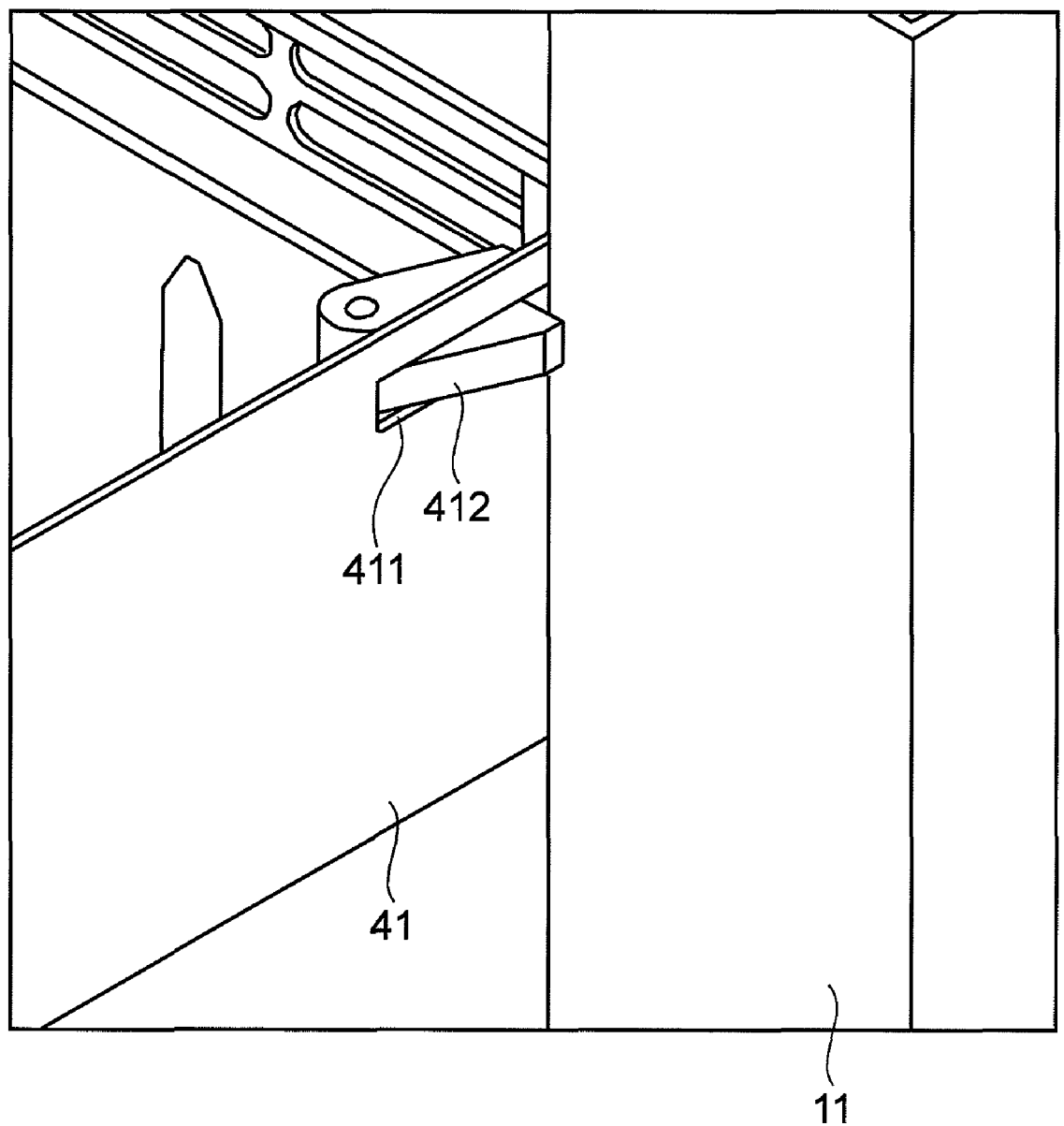
FIG. 26 is an explanatory figure showing the state in which the movable stopper is contacting the rack.

In this manner, when the front cover 44F has been fitted to the case 41 in the normal manner, then the movable stopper 412 is contained within the case 41, against the resistance of the spring. However, if the front cover 44F has not been fitted to the case 41 in the normal manner, then, as shown in FIG. 26, due to the movable stopper 412 which projects to the exterior of the case 41 coming into contact with the rack 11, the storage unit 40D cannot be received in the rack 11. Due to this, the user is made aware of the fact that the installation of the front cover 44F is imperfect, or that he has forgotten to install the front cover 44F.

Figure 27:
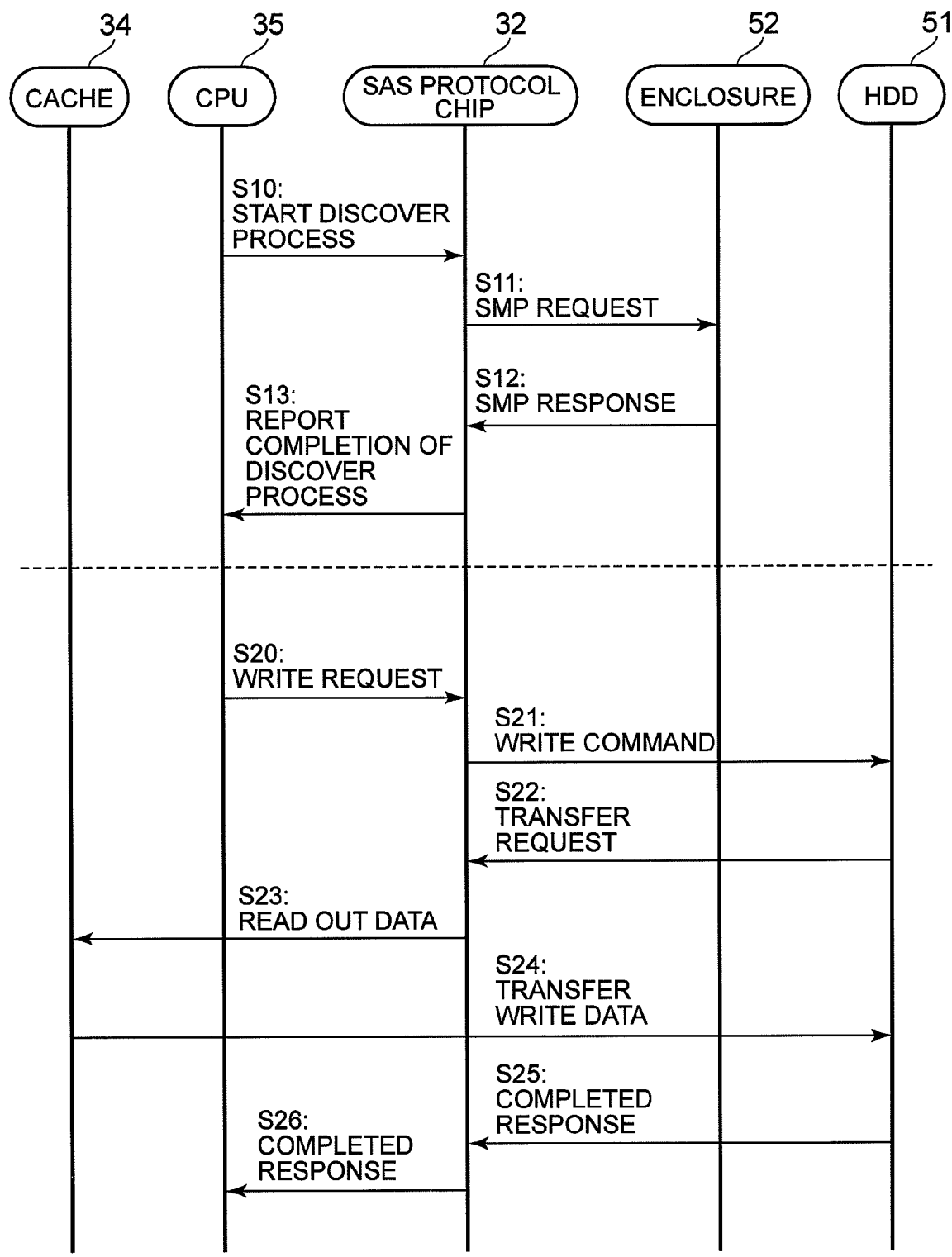
FIG. 27 is a flow chart showing processing for writing data from a controller to a hard disk drive.

FIG. 27 is a flow chart showing write processing, Before performing this write processing, the CPU 35 starts a discover process (a step S10). This discover process is processing for detecting the various storage units 40 (including sub-storage units 50) which are connected to the controller 30, and for registering them in the management table T10.

This discover process will now be explained in a simple manner. Upon a request from the CPU 35, SAS protocol chips issues a SMP (Simple Message Protocol) request to the enclosures 52 (a step S11). The enclosures 52 respond to this SMP request (a step S12). The SAS protocol chips 32 receives SMP responses from the enclosures 52 which are connected, and reports to the CPU 35 (a step S13) that the discovery process has been completed when it has confirmed that each of the storage units 40N and each of the sub-storage units 50 exists. And the CPU 35 registers each of the storage units 40N and each of the sub-storage units 50 which have been detected in the management table T10, in the order in which they have been detected.

The processing for a write command will now be explained. Upon receipt of a write command from a host 60, a CPU 35 of a controller 30 performs preparations for receipt of write data. And the CPU 35 stores the write data which it has received from the host 60 in a cache memory 34.

At a predetermined timing, the CPU 35 starts destage processing. Destage processing is processing to write data to be written, which is stored in the cache memory 34, onto the hard disk drive 51. In the synchronous case, the CPU 35 notifies the host 60 that the processing for the write command has been completed, after the destage processing has been completed. In the asynchronous case, the CPU 35 notifies the host that the processing for the write command has been completed, after the write data from the host 60 has been stored in the cache memory 34. Either the synchronous case or the asynchronous case may be employed.

When the destage processing starts, the CPU 35 issues a write request to the SAS protocol chip 32 (a step S20). Upon receipt of this request from the CPU 35, the SAS protocol chip 32 issues a write command to a predetermined hard disk drive 51 (a step S21). This write command is transmitted via the expander 520 to the predetermined hard disk drive 51. By the predetermined hard disk drive 51, is meant that hard disk drive which possesses the storage region upon which the write data is to be written.

Upon receipt of this write command from the CPU 35, the hard disk drive 51 requests the SAS protocol chip 32 to transfer the write data (a step S22). And the SAS protocol chip 32 reads out the write data from the cache memory 34 (a step S23), and transfers it to the hard disk drive 51 (a step S24).

The hard disk drive 51 writes the write data which it has received from the SAS protocol chip 32 upon its magnetic disk, and reports to the SAS protocol chip 32 the fact that writing has been completed (a step S25). Upon receipt of this report, the SAS protocol chip 32 reports to the CPU 35 the fact that writing upon the hard disk drive 51 has been completed (a step S26). By the above steps S20 through S26, the destage processing is completed.

Figure 28:
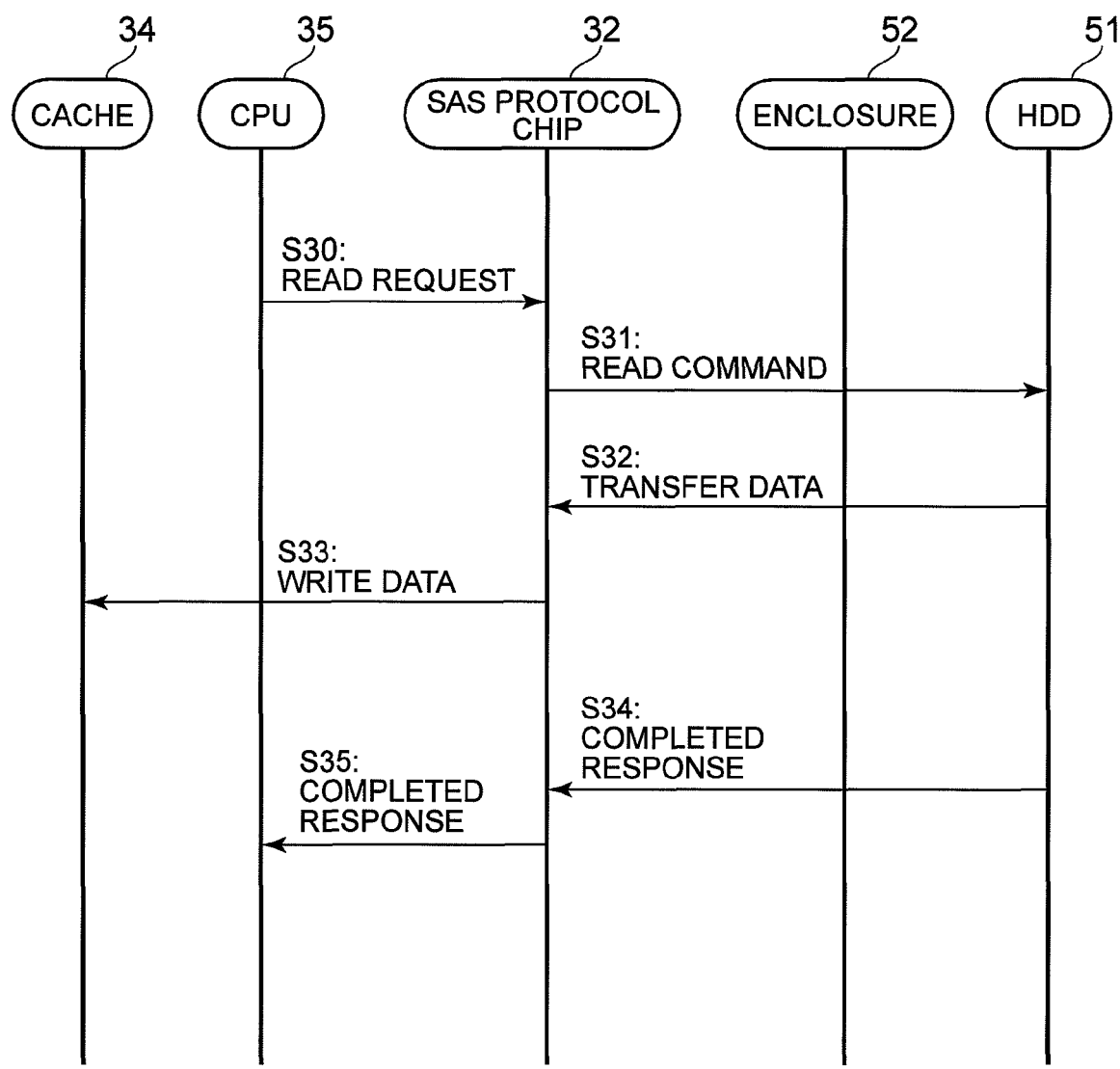
FIG. 28 is a flow chart showing processing for the controller to read out data from the hard disk drive.

FIG. 28 is a flow chart showing read processing. The host 60 issues a read command to the controller 30. In this read command, there are included a logical address which is the destination for being read out from, and a data size.

Upon receipt of this read command, the CPU 35 requests the SAS protocol chip 32 to read out the data (a step S30). And the SAS protocol chip 32 issues a read command to the hard disk drive 51 which is storing the data which is to be read out (a step S31). This read command is sent to this hard disk drive 51 via the expander 520 and so on.

Upon receipt of the read command, the hard disk drive 51 transfers the data which has been requested to the SAS protocol chip 32 (a step S32). And the SAS protocol chip 32 transfers the data which it has received from the hard disk drive 51 to the cache memory 34 and stores it (a step S33). Then, upon receipt of a report from the hard disk drive 51 to the effect that the processing for the read command has been completed, the SAS protocol chip 32 reports to the CPU 35 the fact that the reading out of the data has been completed (a step S35).

Figure 29:
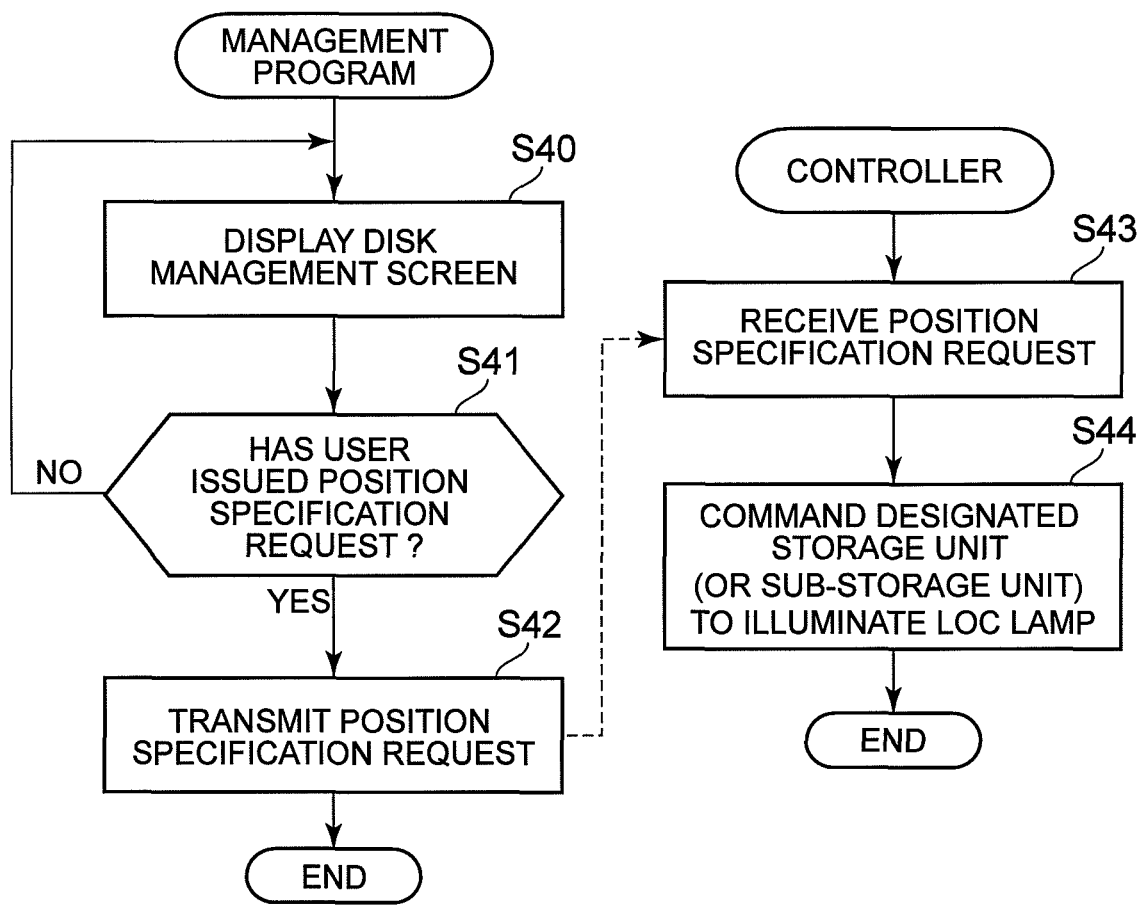
FIG. 29 is a flow chart showing processing for illuminating a lamp of a selected storage unit or sub-storage unit, according to a command from a management program.

For example, in the case of a RAID structure which uses parity, such as RAID5 or RAID6, during the write processing, the parity is calculated and is written upon the hard disk drive 51. If a portion of the data is lost, then it is still possible to recover this lost data from other data and the parity upon the same stripe. FIG. 29 shows the processing for specifying the position of a storage unit 40N or 40D, or the position of a sub-storage unit 50. According to a command from the user, the management program 61 displays a management screen (a step S40). Then the management program 651 decides whether or not position specification has been requested by the user (a step S41). If the user has requested position specification (YES in the step S41), then the management program 61 requests the controller 30 to specify the position (a step S42). In this request, for example, the SAS address of the designated storage unit may be included.

Upon receipt of this position specification request from the management program 61 (a step S43), the CPU 35 of the controller 30 commands the designated storage unit to illuminate its position display lamp 57 (a step S44).

Due to this, the user is able to check in a simple and easy manner where in the rack 11 the desired storage unit is mounted. For example if, due to reduction or extension, it is necessary to check a storage unit which is positioned at the very end upon a connection, then the user is able to check this simply and easily, by the position display lamp 57 of the final storage unit being illuminated. Moreover since, in this embodiment, position display lamps 57 are provided separately to each individual one of the sub-storage units 50L and 50R as well, accordingly it is possible to confirm the mounting position of the sub-storage unit.

Figure 30:
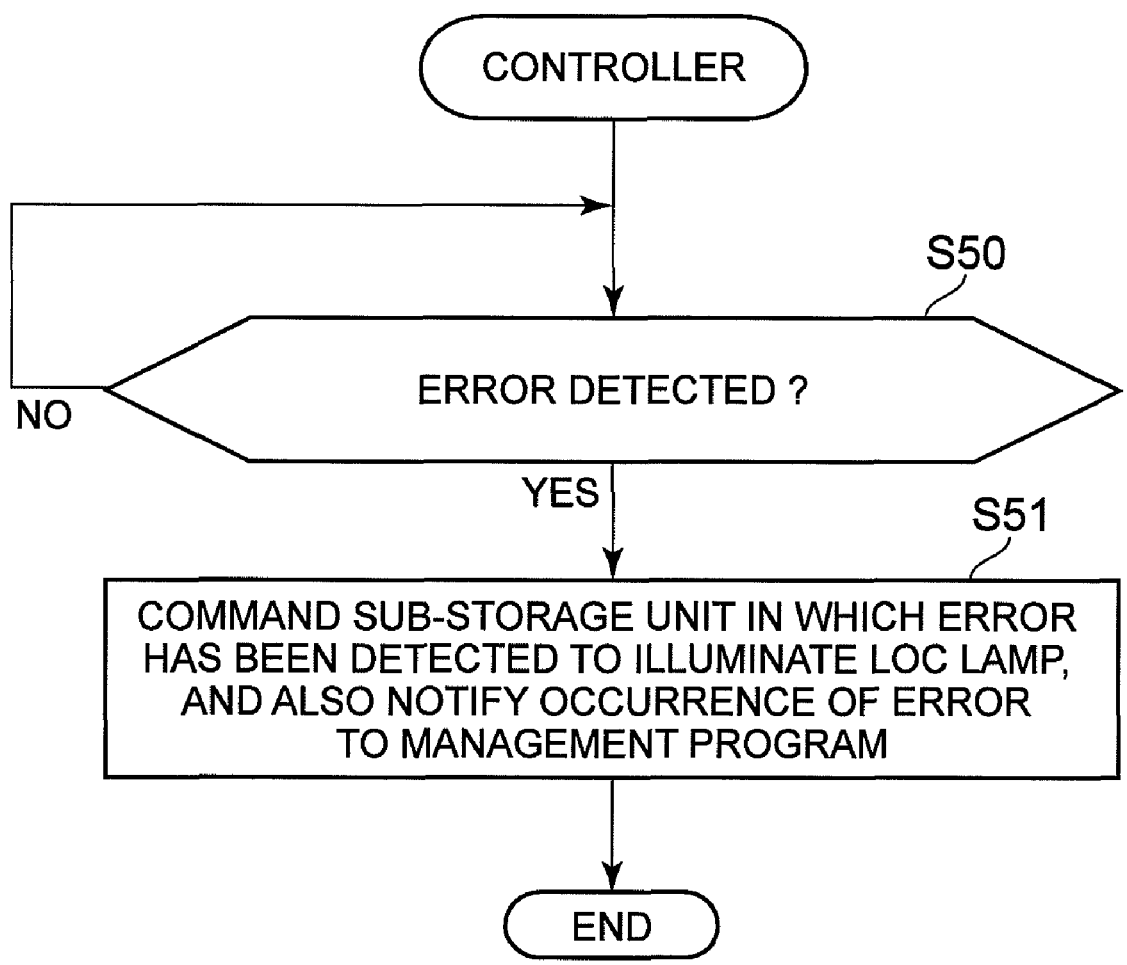
FIG. 30 is a flow chart showing processing for illuminating a lamp of a storage unit or a sub-storage unit when an error has occurred.

FIG. 30 shows processing when an error has been detected. The controller 30 monitors whether or not an error has occurred in a storage unit or a sub-storage unit (a step S50). If an error has been detected (YES in the step S50), then the controller 30 illuminates the position display lamp 57 which corresponds to the storage unit or the sub-storage unit in which the error has occurred, and/or illuminates the lamp 546 (refer to FIG. 12) (a step S44). Moreover, the controller 30 also may notify the occurrence of the error to the management program 61 (a step S44).

Figure 31:
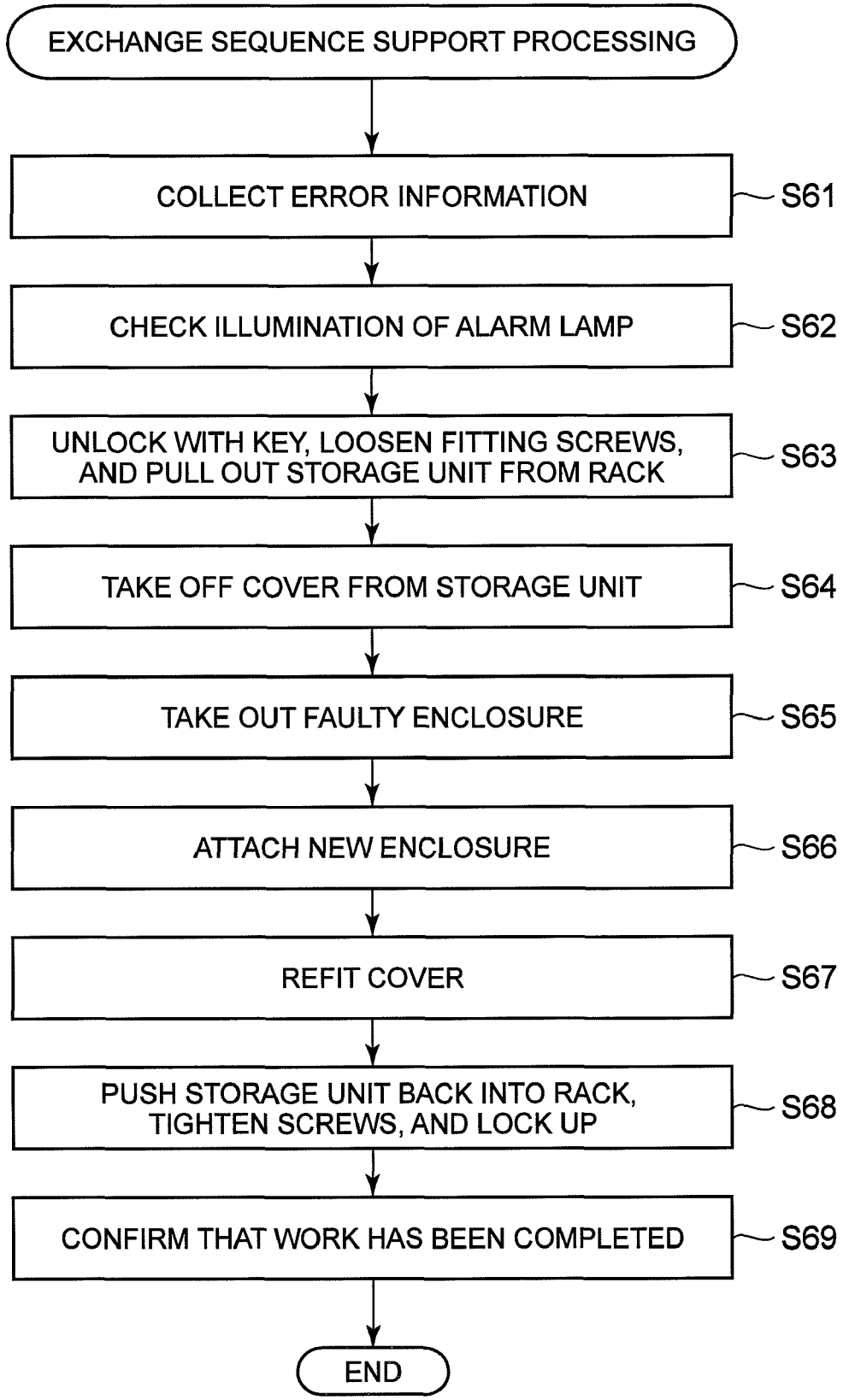
FIG. 31 is a flow chart showing a sequence for exchange during maintenance work.

FIG. 31 shows processing for directing an exchange sequence by the user during maintenance work. Here, an example is explained of a case in which an enclosure 52 which has failed is exchanged. The user collects error information about the storage control device 10 via the management program 61 (a step S61), and checks whether or not an error has occurred.

If an error is present, the user checks that an alarm lamp (here, the lamp 546 is used as an alarm lamp) is illuminated (a step S62). The user specifies the storage unit 40D upon which the alarm lamp 546 is illuminated, and puts the key into the lock device 45 of this storage unit 40D and unlocks it. And the user pulls out this storage unit 40D from its rack 11 (a step S63).

The user removes the cover 44F of the storage unit 40D (a step S64), and pulls out the enclosure 52 which has failed from within the case 41 (a step S65). And the user inserts a new enclosure 52 into the case 41 from the upper opening portion of the case 41, and attaches the printed circuit 58 (a step S66).

Then the user refits the cover 44F to the case 41 (a step S67). By doing this, the movable stopper 412 is contained within the case 41. And the user inserts the storage unit 40D into the rack 11, fixes the storage unit 40D to the rack 11 by using the fitting screws 433, and then locks the lock device 45 (a step S68).

The user then confirms that the work has been finished normally via the management screen supplied by the management program 61 (a step S69). The above sequence S61 through S69 may be notified to the user upon the screen which is supplied by the management program 61. This may be notified to the user via messages, text, audio, or images, such as, for example, "Error has occurred. Please exchange units according to the following sequence." (S61); "## enclosure is faulty. Please check that the alarm light on ## enclosure is illuminated." (S62); "Please unlock, loosen fitting screws, and pull storage unit out from rack." (S63); "Please take off front cover of storage unit." (S64); "Please take out faulty enclosure." (S65); "Please fit new enclosure." (S66); Please fit front cover onto case properly." (S67); "Please insert storage unit into rack, tighten fitting screws, and lock." (S68); "Please check that error has been eliminated." (S69).

Figure 32:
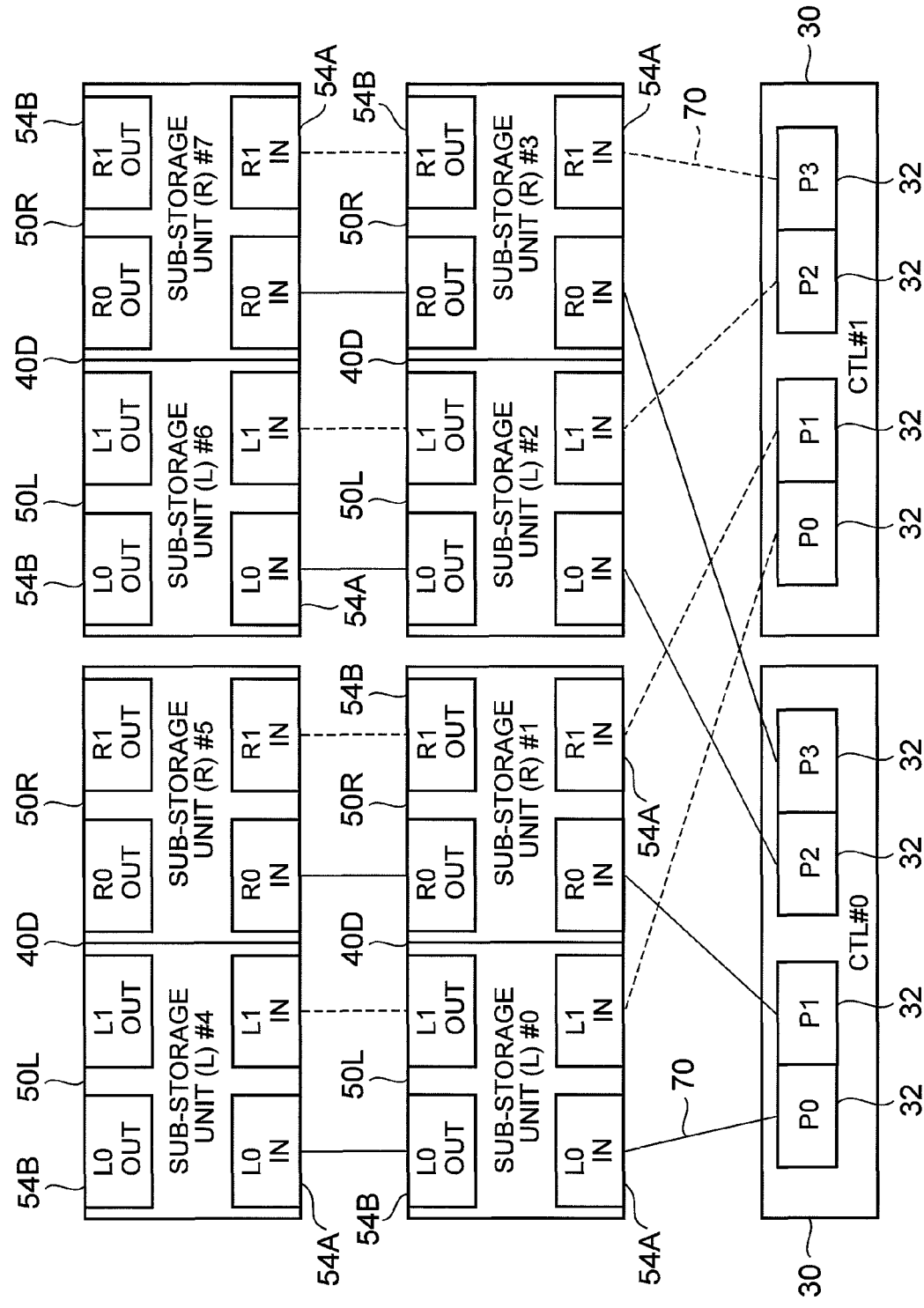
FIG. 32 is an explanatory figure showing the state of connection of a storage unit.

FIG. 32 is an explanatory figure showing the state of connection of the high density type storage units 40D. Each of the controllers 30 of this embodiment includes four SAS protocol chips 32. In FIG. 32, reference symbols P0 through P3 are appended to the communication ports of the SAS protocol chips 32 in order to distinguish them.

As shown in FIG. 32, the sub-storage units 50 which these high density type storage unit 40D possess are connected in a daisy chain, and each of the sub-storage units 50 has its own two access paths. One of these access paths is the 0 system path (#0 system), and the other access path is the 1 system path (#1). The 0 system path is accessed by one of the controllers 30 (#0), while the 1 system path is accessed by the other controller 30 (#1).

The sub-storage units 50 are connected to the SAS protocol chips 32 so that the load upon each of the SAS protocol chips 32 becomes equal, in other words so that each of the total of four communication paths is used approximately equally.

The unit numbers (#0 through #7) of the sub-storage units 50 are determined in the order in which they are connected to the controller 30. The frequency with which each of the sub-storage units 50 is used is greater, in ascending order of its unit number. Accordingly, the sub-storage units 50 are connected to the controller in the order P0 through P3, so that each of the SAS protocol chips 32 will be used approximately equally.

In concrete terms: initially, the sub-storage unit 50 (#0) is connected to the communication port P0; next, the sub-storage unit 50 (#1) is connected to the communication port P1; next, the sub-storage unit 50 (#2) is connected to the communication port P2; and finally, the sub-storage unit 50 (#3) is connected to the communication port P3. Thereby, one each of the sub-storage units 50 comes to be connected to each of the communication ports (communication paths).

Subsequently, in a similar manner, the sub-storage units are connected in order to the communication ports. By doing this, the frequency of use of each of the communication ports is made to be approximately equal, so that it is possible to disperse the load.

Figure 33:
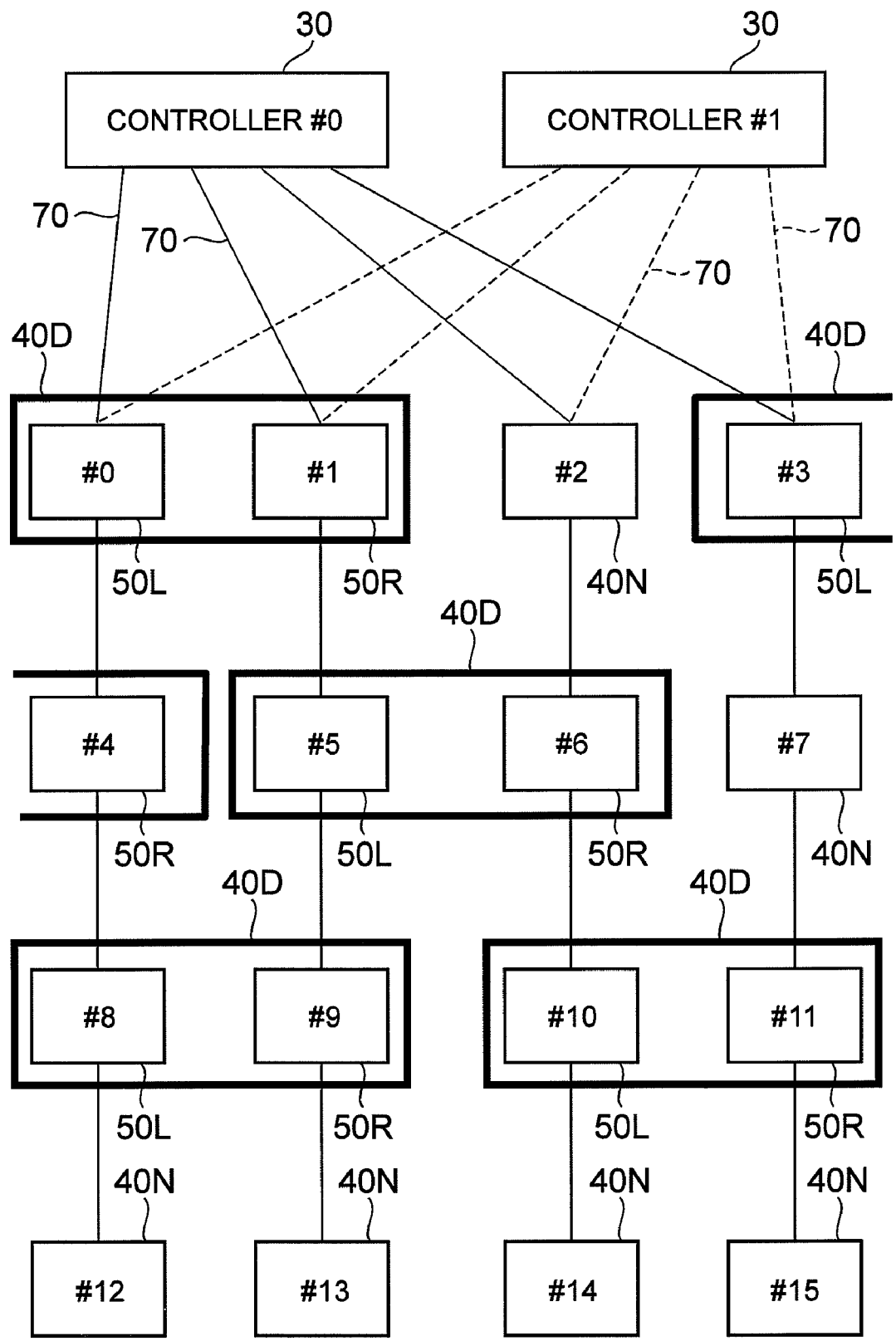
FIG. 33 is an explanatory figure showing a situation in which a normal type storage unit and a high density storage unit according to the present invention are being used in coexistence.

FIG. 33 is an explanatory figure showing a situation in which a normal type storage unit 40N and a high density storage unit 40D are being used together in coexistence. Although mainly the high density storage unit 40D has been explained, in this embodiment, it is possible to use both the normal type storage unit 40N and the high density storage unit 40D at the same time. In FIG. 33, in order to reduce the burden upon the reader, this situation in which storage units 40D and 40N of different types are used together is shown schematically.

As shown in FIG. 33, the normal type storage unit 40N (#2) is provided next to the high density type storage unit 40D which possesses the sub-storage unit 50L (#0) and the sub-storage unit 50R (#1). And the high density type storage unit 40D which possesses the sub-storage unit 50L (#3) and the sub-storage unit 50R (#4) is provided next to this normal type storage unit 40N (#2). Moreover, the high density type storage unit 40D which possesses the sub-storage unit 50L (#5) and the sub-storage unit 50R (#6) is provided next thereto.

As described above, since the high density type storage units 40D of this embodiment are provided with the sub-storage units 50L and 50R which operate independently of one another, accordingly, along with it being possible to make the installation size of the storage control device 10 small, also it is possible to make the storage capacity of the storage control device 10 large, so that it is possible to reduce the costs of operation and so on.

In this embodiment, the shield portions 514, 525, and 591 are provided so as to close the tops of the cooling air draft passages AF. Accordingly, even in the state in which during maintenance work the front cover 44F is removed, it is possible to stop or to suppress the flowing in of air into the cooling air draft passages AF from the aperture in the upper surface of the case 41. As a result it is possible to perform cooling in a stable manner, even in the state in which the front cover 44F has been removed. Accordingly, it is possible to perform maintenance work over a comparatively long time period, and it is possible to suppress the occurrence of man-made errors due to limitation of the time period for maintenance.

In this embodiment, the cooling fans 552F and 552R are arranged separately within the power supply devices 55, at the front and at the rear thereof. Due to this, it is possible to increase the amount of the draft of cooling air, as compared with the case of providing only one cooling fan, and it is possible to enhance the cooling efficiency. Furthermore, since the cooling fan 552F at the front side is positioned within the case 41, it is possible to reduce the amount of noise which escapes to the exterior. Moreover, since it is possible to increase the amount of the draft of cooling air, accordingly it is not necessary to enhance the rotational speeds of the cooling fans 552F and 552R, and, due to this, it is possible to reduce the noise and the consumption of electrical power.

Since, in this embodiment, the cover is separated into the front cover 44F and the rear cover 44R, accordingly, when exchanging a hard disk drive 51 or an enclosure 52 or the like, it is sufficient to take off only the front cover 44F from the case 41. Due to this, during maintenance work, it is possible to prevent the area of the aperture in the upper surface of the case 41 from becoming greater than necessary, so that it is possible to prevent decrease of the cooling efficiency.

In this embodiment, the shield plates 432 which shield the fitting screws for fixing the storage unit 40D into the rack 11, and the lock device 45, operate together. Accordingly, when locking the unit, it is possible to cover over the fitting screws 433 with the shield plates 432, so that it is possible to prevent theft of the storage unit 40D. Moreover, if the fitting screws 433 are not tightened up properly, then it is not possible to lock up the lock device 45, so that it is also possible to inform the user that the fitting is not perfect, and thus the convenience of use is enhanced.

In this embodiment, the movable stopper 412 is provided, contained within the case 41 by the cover 44F, and always biased towards the exterior of the case 41 Accordingly, if the cover 44F is not properly fitted to the case 41, then the movable stopper 412 contacts against the rack 11. Due to this, it is possible to draw the attention of the user to the fact that the cover 44F is imperfectly fitted, so that the convenience of use is enhanced.

Embodiment Two

A second embodiment will now be explained with reference to FIGS. 33 and 34. This embodiment corresponds to a variant of the first embodiment described above. Accordingly, the explanation will focus upon the points of difference from the first embodiment. The distinguishing feature of this embodiment is that the front cover 44F is divided into two parts, i.e. a left part and a right part, corresponding to the two sub-storage units 50L and 50R.

Figure 34:
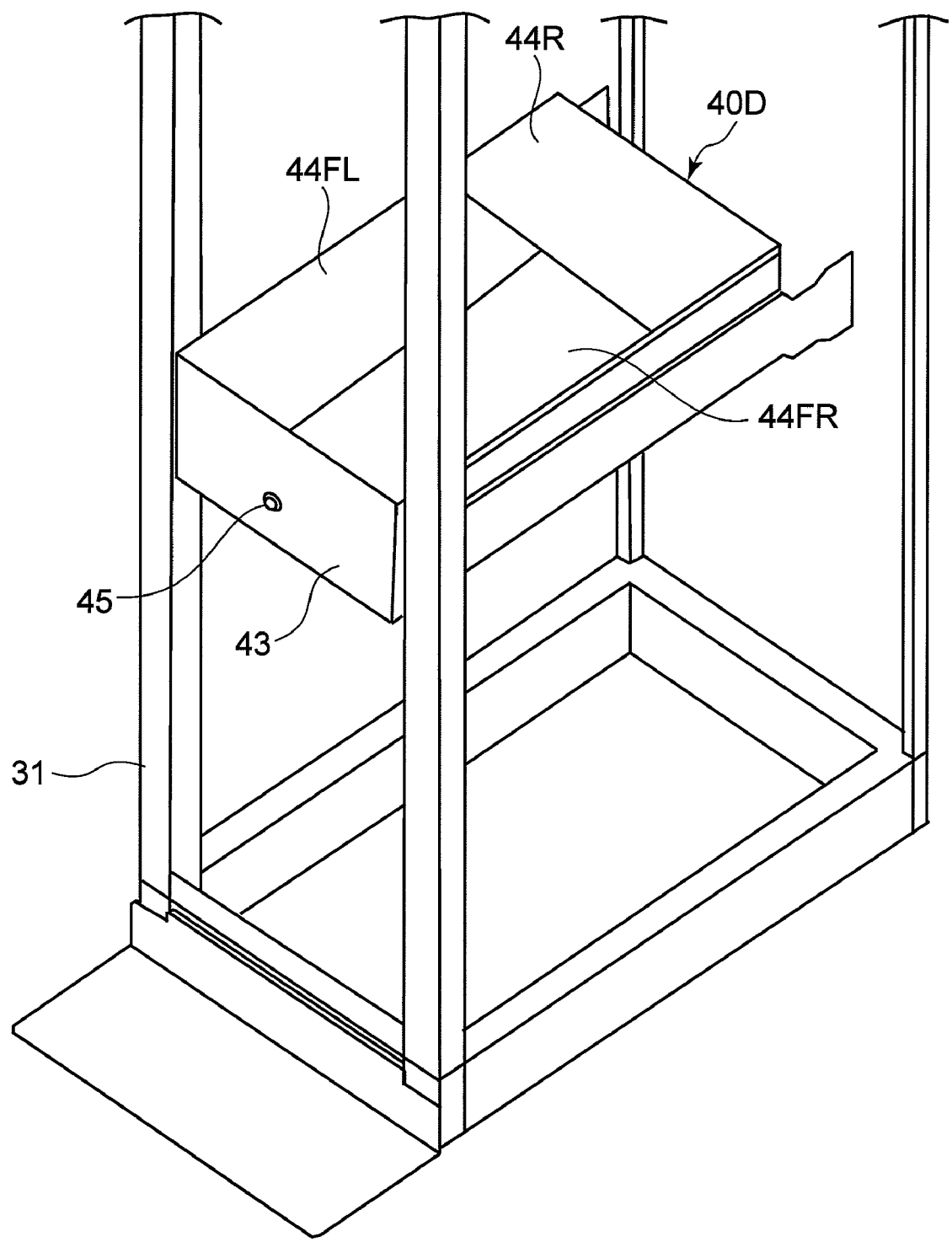
FIG. 34 is a perspective view of a storage unit fitted to a rack, according to a second embodiment.
Figure 35:
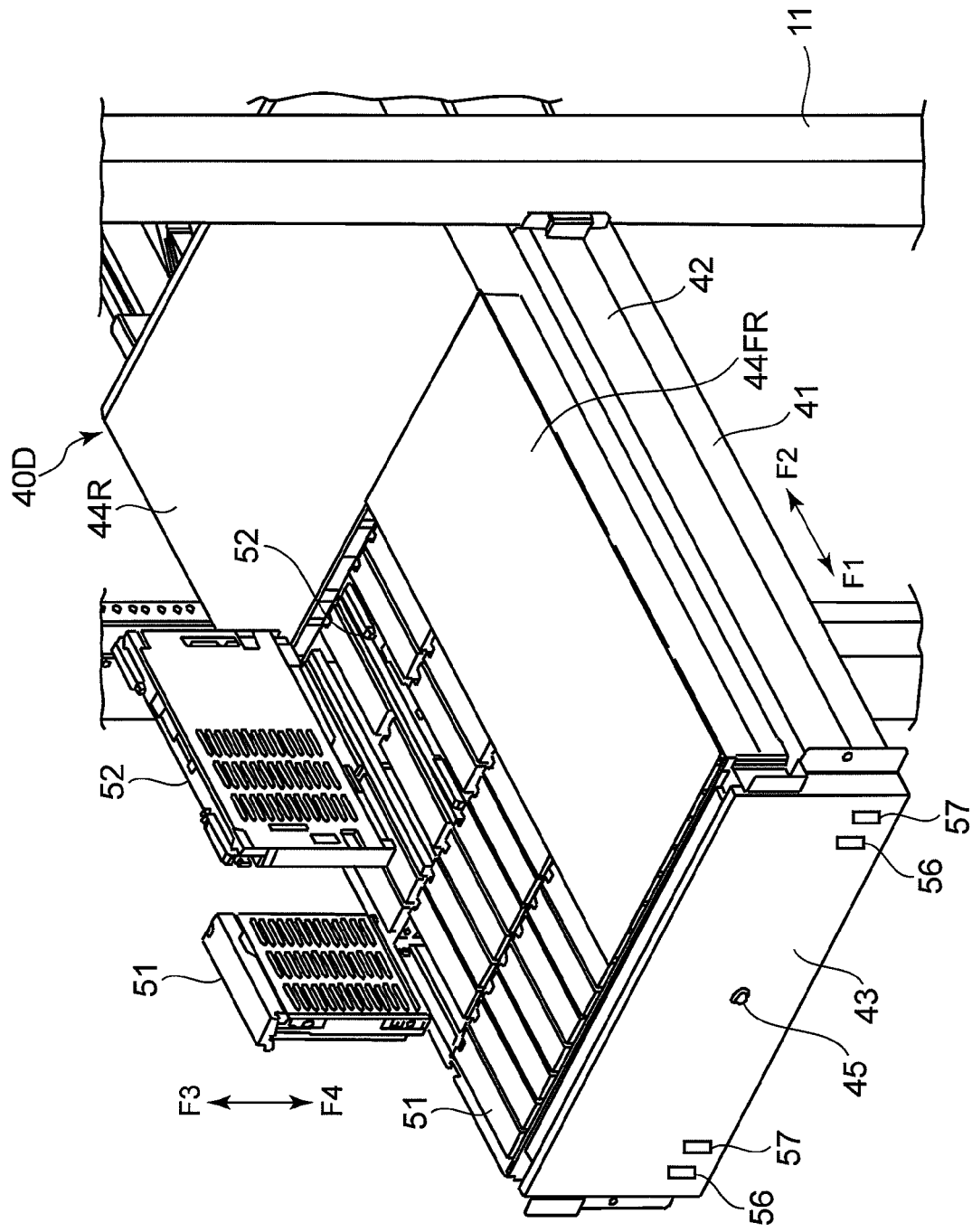
FIG. 35 is a perspective view showing a state in which only one of two separated left and right front covers is removed.

FIG. 34 is a perspective view of a storage unit fitted to a rack, according to this second embodiment As shown in the perspective view of FIG. 35, the user is able to perform maintenance work by taking off from the case 41 only that cover which corresponds to the desired sub-storage unit. In the example shown in FIG. 35, the situation is shown in which the left side cover 44FL is removed, so that maintenance work may be performed upon the sub-storage unit 50L.

With this embodiment having this structure, similar advantageous operational effects may be obtained as in the case of the first embodiment. Moreover, with this embodiment, since the cover 44F which corresponds to the sub-storage units 50L and 50R is subdivided, thus, during maintenance work, it is possible to keep the area of the upper surface of the case 41 which is opened smaller than in the case of the first embodiment. Accordingly, it is possible to perform the maintenance work while not decreasing the cooling performance by very much.

It should be understood that the present invention is not limited to the embodiments described above. Within the proper scope of the present invention, a person skilled in the art will be able to implement various additions and/or changes and so on to any particular embodiment thereof.

What is claimed is:

1. A storage control device comprising a control device and a storage unit controlled by said control device, wherein:
   said storage unit comprises a chassis which has an opening portion,
   a plurality of sub-storage units provided within said chassis which operate independently of one another, and
   a lid unit which closes said opening portion; and
   each of said sub-storage units comprises:
   a plurality of storage devices which are attached in one region of said chassis;
   at least one unit controller or more in charge of communication between said storage devices and said control device, provided between said storage devices;
   at least one power supply device or more attached in another region of said chassis, and supplying electrical power to said storage devices and said unit controllers;
   a cooling fan provided within said chassis;
   a cooling air draft passage which is formed from one side of said chassis towards another side of said chassis, and which conducts a cooling air draft created by the operation of said cooling fan; and
   a shield portion provided so as to close a side of said opening portion of said cooling air draft passage, in order to suppress the flow of air between said cooling air draft passage and said opening portion.

2. A storage control device according to claim 1, wherein:
   said lid unit comprises a first lid unit for removably closing a region of said opening portion which corresponds to said one region, and a second lid unit for closing a region of said opening portion which corresponds to said other region; and
   said shield portions are provided at portions of said cooling air draft passages which correspond to said one region.

3. A storage control device according to claim 2, wherein one said first lid unit is provided for each said sub-storage unit.

4. A storage control device according to any one of claims 1 through 3, wherein one of said cooling fans is provided at one side within said power supply device, and another of said cooling fans is provided at another side within said power supply device.

5. A storage control device according to any one of claims 1 or 2, wherein said cooling air draft passages include gaps defined between said storage devices, gaps defined between said storage devices and said unit controller, and spaces within said power supply device.

6. A storage control device according to any one of claims 1 or 2, wherein said shield portions comprise first shield portions provided to said storage devices and a second shield portion provided to said unit controller.

7. A storage control device according to claim 6, wherein said shield portions further include a third shield portion, provided to a dummy module which is fitted within said chassis instead of one said storage device.

8. A storage control device according to claim 6, wherein:
   said first shield portion is provided on the side of said opening portion on a predetermined side of the two sides of said storage device; and
   said second shield portion is provided on the sides of said opening portions on the two sides of said unit controller.

9. A storage control device according to claim 7, wherein:
   said first shield portion is provided on the side of said opening portion on a predetermined side of the two sides of said storage device;
   said second shield portion is provided on the sides of said opening portions on the two sides of said unit controller; and
   said third shield portion is provided on the side of said opening portion on a predetermined side of the two sides of said dummy module.

10. A storage control device according to any one of claims 1 or 2, wherein:
    a plurality of display units, corresponding to said sub-storage units, are provided to said chassis; and
    said unit controller operates those display units, among said display units, which correspond to sub-storage units designated by said control device.

11. A storage control device according to any one of claims 1 or 2, wherein:
    said chassis is provided so as to be fittable and removable to a rack, via a fixing member; and
    a shield portion which covers at least a portion of said fixing members, and which is for limiting the operation of said fixing member, is operated together with a locking device provided to said chassis.

12. A storage control device according to claim 11, wherein, when said lock device is unlocked, the limitation of said actuation by said shield portion is cancelled; and, when said lock device is locked, the actuation of said fixing member is limited.

13. A storage control device according to any one of claims 1 or 2, wherein:

a stopper unit is provided to said chassis, so as to be displaceable between the interior and the exterior of said chassis; and when said lid unit is attached to said opening portion, said stopper unit is contained within said chassis; and, when said lid unit is not attached to said opening portion, said stopper unit projects to the exterior of said chassis, so as to contact against said rack.

* * * * *